United States Patent
Niira et al.

(10) Patent No.: US 7,910,916 B2
(45) Date of Patent: Mar. 22, 2011

(54) MULTI-JUNCTION TYPE SOLAR CELL DEVICE

(75) Inventors: Koichiro Niira, Higashiomi (JP);
Hirofumi Senta, Higashiomi (JP);
Hideki Hakuma, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 12/480,513

(22) Filed: Jun. 8, 2009

(65) Prior Publication Data

US 2009/0272423 A1  Nov. 5, 2009

Related U.S. Application Data

(62) Division of application No. 10/878,488, filed on Jun. 25, 2004, now Pat. No. 7,560,750.

(30) Foreign Application Priority Data

Jun. 26, 2003 (JP) .................. 2003-182584
Jul. 24, 2003 (JP) .................. 2003-201417

(51) Int. Cl.
*H01L 31/00* (2006.01)
(52) U.S. Cl. ............... 257/21; 257/16; 257/22; 257/30; 257/33; 257/E29.339
(58) Field of Classification Search .............. 257/16, 257/21, 22, 30, 33, 471, E29.339
See application file for complete search history.

(56) References Cited

U.S. PATENT DOCUMENTS

| | | | |
|---|---|---|---|
| 4,688,068 A | 8/1987 | Chaffin et al. | 136/249 |
| 5,100,478 A | 3/1992 | Kawabata | 136/249 |
| 5,151,385 A | 9/1992 | Yamamoto et al. | 438/96 |
| 5,233,265 A | 8/1993 | Takasaki et al. | 313/366 |
| 5,516,983 A | 5/1996 | Kishimoto et al. | 174/1 |
| 5,730,808 A | 3/1998 | Yang et al. | 136/249 |

(Continued)

FOREIGN PATENT DOCUMENTS

JP  60201670 A  10/1985

(Continued)

OTHER PUBLICATIONS

Green, et al., "The MINP Solar Cell—A New High Voltage, High Efficiency Silicon Solar Cell", Proc. 15$^{th}$, IEEE PVSC (1981), Australia, p. 1405-1408.

(Continued)

*Primary Examiner* — Wael M Fahmy
*Assistant Examiner* — John C Ingham
(74) *Attorney, Agent, or Firm* — DLA Piper LLP (US)

(57) ABSTRACT

In a photoelectric conversion device, in a contact between a p-type semiconductor 3*a* and an electrode 2, an n-type semiconductor 6 of a conductivity type opposite to that of the p-type semiconductor is provided between the p-type semiconductor 3*a* and the electrode 2. The existence of the n-type semiconductor 6 allows a recombination rate of photo-generated carriers excited by incident light to be effectively reduced, and allows a dark current component to be effectively prevented from being produced. Therefore, it is possible to improve photoelectric conversion efficiency as well as to stabilize characteristics. Further, a tunnel junction is realized by increasing the concentration of a doping element in at least one or preferably both of the p-type semiconductor 3*a* and the n-type semiconductor 6 in a region where they are in contact with each other, thereby keeping ohmic characteristics between the semiconductor and the electrode good.

16 Claims, 13 Drawing Sheets

U.S. PATENT DOCUMENTS

| | | | |
|---|---|---|---|
| 6,121,541 A | 9/2000 | Arya | 136/255 |
| 6,133,590 A | 10/2000 | Ashley et al. | 257/106 |
| 6,278,136 B1 | 8/2001 | Nitta | 257/99 |
| 6,380,601 B1 | 4/2002 | Ermer et al. | 257/440 |
| 6,635,507 B1 | 10/2003 | Boutros et al. | 438/57 |
| 2002/0008243 A1 | 1/2002 | Goetz et al. | 257/79 |
| 2002/0050289 A1 | 5/2002 | Wada et al. | |
| 2002/0179918 A1 | 12/2002 | Sung et al. | 257/99 |
| 2003/0070707 A1 | 4/2003 | King et al. | |

FOREIGN PATENT DOCUMENTS

| | | | | |
|---|---|---|---|---|
| JP | 02-076266 | 3/1990 | | |
| JP | 02-076267 | 3/1990 | | |
| JP | 04-127580 | 4/1992 | | |
| JP | 04-132269 | 5/1992 | | |
| JP | 04240778 | * 8/1992 | | 257/53 |
| JP | 2001-313272 | 11/2001 | | |
| JP | 2002-141524 | 5/2002 | | |
| JP | 2002-289832 | 10/2002 | | |
| JP | 2003-173980 | 6/2003 | | |

OTHER PUBLICATIONS

English translation of Japanese office action dated Jan. 4, 2010 for corresponding Japanese application 2004205264 lists the references above.

English language translation of German office action dated Nov. 19, 2010 for corresponding German application 102004031950.2.

* cited by examiner

| 2: | TCO (TRANSPARENT CONDUCTIVE OXIDE) | |
|---|---|---|
| 31d: | μc-Si:H | n TYPE |
| 31a: | a-SiC:H | p TYPE |
| 31b: | a-Si:H | i TYPE |
| 31c: | μc-Si:H | n TYPE |
| 32a: | μc-Si:H | p TYPE |
| 32b: | μc-Si:H | i TYPE |
| 32c: | μc-Si:H | n TYPE |
| 32d: | μc-Si:H | p TYPE |
| 4: | METAL | |

| BAND GAP | Eg |
|---|---|
| SINGLE CRYSTALLINE Si | ABOUT 1.1eV |
| a-Si : H | 1.6~1.8eV |
| μc-Si : H | SMALLER THAN a-Si : H (DEPENDING ON RATIO OF CRYSTALLNE VOLUME FRACTION) |
| a-SiC : H | SLIGHTLY LARGER THAN a-Si : H |

MULTI-JUNCTION TYPE SOLAR CELL DEVICE

This application is a divisional of application Ser. No. 10/878,488 filed Jun. 25, 2004, the entire contents of which are incorporated herein by reference. This application is based on application Nos. 2003-182584 filed Jun. 26, 2003 and 2003-201417 filed Jul. 24, 2003, the entire contents of which are incorporated hereinto by reference.

BACKGROUND OF THE INVENTION

1. Field of the Invention

The present invention relates to a semiconductor/electrode contact structure, and a semiconductor device using the same. Examples of the semiconductor device include a photoelectric conversion device such as a solar cell device, a diode, a transistor, and a thyristor.

2. Description of the Related Art

A semiconductor device has a contact between an electrode composed of a metal or a conductive material such as a conductive oxide material and a semiconductor. On the side of the semiconductor in the semiconductor/electrode contact, a defect level called an interface level is generally produced. Such a defect level occurs due to impurities and distortion, non-equilibrium in a semiconductor forming process, etc., and functions as a carrier recombination center. Therefore, the semiconductor/electrode contact greatly affects semiconductor device characteristics.

The recombination of carries in the semiconductor/electrode contact interface generally functions as a factor which degrades current/voltage characteristics of the semiconductor device. A recombination rate R in the interface is proportional to a recombination center density Nr in the interface and a minority carrier density n on an interface surface.

$$R \propto Nr \times n$$

It is considered that the recombination center density Nr and a defect level density Nd in the interface are exactly in a relationship of Nr<Nd. In a range handled in the present case, however, there is hardly any problem even if it is considered that Nr≈Nd.

The variation in carrier recombination characteristics in the interface greatly affects the yield of the semiconductor device. In order to improve the characteristics of the semiconductor device and to improve the yield thereof, therefore, it is important to sufficiently reduce a carrier recombination rate R in the semiconductor/electrode contact interface.

A solar cell which is represented by a photoelectric conversion device will be described as an example.

Generally, the solar cell has a pn junction or a pin junction composed of a semiconductor. Examples of the electrode are an electrode coming into contact with a p-type semiconductor and an electrode coming into contact with an n-type semiconductor.

FIG. 10 illustrates an example of a solar cell device structure in a case where a pin junction is used. In FIG. 10, reference numeral 1 denotes a substrate, reference numeral 2 denotes a front electrode, reference numeral 3 denotes a semiconductor multi-layer film, reference numeral 3a denotes a p-type semiconductor layer, reference numeral 3b denotes an i-type semiconductor layer, reference numeral 3c denotes an n-type semiconductor layer, and reference numeral 4 denotes a rear electrode.

Here, light is incident on the substrate 1, and is absorbed and photoelectrically converted in the semiconductor multi-layer film 3, to generate an electron-hole pair. In the case of the pin junction as in the illustrative example, however, the electron-hole pair generated by absorbing and photoelectrically converting light particularly in the i-type semiconductor layer 3b serving as a photoactive layer is a main origin of photovoltaic power. The generated electrons and holes (photo-generated carriers) are respectively swept toward the n-type semiconductor layer 3c or the p-type semiconductor layer 3a in accordance with an internal electric field formed in the i-type semiconductor layer 3b, so that the electrons are excess in the n-type semiconductor layer 3c, and the holes are excess in the p-type semiconductor layer 3a. Accordingly, a forward bias voltage is generated with respect to the pin junction. The excess carriers respectively flow into the electrodes, so that a current flows through a circuit which connects a solar cell and a load to each other. The product of the forward bias voltage and the current is photovoltaic power to be outputted.

FIG. 11 is a band diagram of the solar cell. In FIG. 11, Ec indicates an energy position in a lower part of a conduction band edge, Ev indicates an energy position in an upper part of a valence band edge, Ed indicates a defect level (an interface defect level) on the side of the semiconductor in the semiconductor/electrode interface, and Ef indicates a Fermi level.

Here, the existence of the defect level in the semiconductor/electrode interface (in the illustrative example, the first electrode 2/the p-type semiconductor layer 3a, and the n-type semiconductor layer 3c/the second electrode 4) can adversely affect solar cell characteristics mainly due to the following two factors.

The first factor is degradation (increase) in diode characteristics (in the case of the solar cell, increase in a so-called dark current). This is caused by the production of a recombination current in the interface. The increase in the dark current causes reduction in an open circuit voltage Voc and a fill factor FF as the solar cell characteristics.

The second factor is reduction in a light current. This is caused by the fact that the photo-generated carriers generated in the semiconductor region are lost upon being recombined in the interface and causes reduction in a short-circuit current density Jsc as the solar cell characteristics.

There is a measure to highly dope a portion of a semiconductor interface region in the semiconductor/electrode contact against the problems. This is a method utilizing the fact that a recombination rate R in an interface is reduced because a minority carrier density n is generally reduced in a highly doped portion, and is generally called a HL (High-Low) junction. The technique may, in some cases, be called a BSF structure in connection with the historical process of an effect (BSF effect=Back Surface Field effect) particularly in a case where it is formed on the back surface region of the solar cell.

The measure allows the minority carrier density n to be reduced. However, there is no reason that the recombination center density Nr caused by the interface defect level is expected to decrease. Contrary to this, as a doping amount increases, a distortion amount increases, resulting in defect formation. Consequently, the quality of the semiconductor is generally degraded. Therefore, it is considered that the recombination center density Nr in the interface is generally increased.

It is herein considered that the maximum value of the interface defect level density is given as a DB density in a case where all coupling hands in the interface becomes a dangling bond (DB). In the case of Si, for example, the DB density in this case is a value which is as large as approximately $1 \times 10^{15}$/$cm^2$, and the recombination center density Nr is also a very large value on approximately the same order.

As described above, the recombination rate R in the interface is proportional to the product of the minority carrier density n and the recombination center density Nr. Even if the minority carrier density n can be reduced, therefore, the recombination rate R cannot be sufficiently reduced unless the recombination center density Nr can be reduced (or if the recombination center density Nr is conversely increased).

In practice, it cannot be said that the reduction in the recombination rate R in the interface in the measure is not sufficient to further increase the efficiency of the solar cell. Therefore, a technique for further interposing a very thin $SiO_2$ film between the HL junction and the electrode, for example, to also reduce the recombination center density Nr is also developed. In the improving technique, however, it is not easy to form a high-quality $SiO_2$ film for sufficiently reducing the recombination center density Nr into a very thin film. Further, a high-temperature process is required to form the high-quality $SiO_2$ film. In the actual application, therefore, various restrictions in processes occur even in a bulk-type silicon solar cell. The method cannot be applied at all to the thin film silicon solar cell manufactured in low-temperature processes.

Furthermore, there is a method of widening a band gap in a portion, of an interface region, on the side of the semiconductor in the semiconductor/electrode contact. In the portion where the gap is widened, the minority carrier density n is generally reduced, so that the recombination rate R in the interface is reduced.

From a historical view, an example of an amorphous silicon solar cell using hydrogenated amorphous silicon (a-Si:H), in which a p-type layer in contact with a front electrode (a transparent conductive film such as $SnO_2$) is composed of a hydrogenated amorphous silicon carbide (a-SiC:H, a band gap≈2.0 eV), and a hetero junction is formed between the p-type layer and an I-type layer composed of an a-Si:H (a band gap≈1.8 eV) serving as a photoactive layer, has been well known.

Also in this method, it is possible to reduce the minority carrier density n. However, it is not assured that the defect level density Nr in the interface is not increased. Generally, the widening of a gap not only reduces a minority carrier density n but also reduces majority carriers. If the gap is too widened, therefore, the flow of the majority carriers is prevented, so that ohmic characteristics between the semiconductor and the electrode, which are required as a premise, are degraded. Therefore, the widening of the gap has a limitation.

Although description was made by taking as an example the solar cell which is represented by the photoelectric conversion device out of the semiconductor devices, the nature in principle of the above-mentioned problem (the recombination of carriers by the existence of the interface defect level) is generally common to the semiconductor devices in general each having the semiconductor/electrode contact. In a diode, for example, if the recombination rate R in the semiconductor/electrode contact is large, this causes a factor which degrades current-voltage characteristics such as rise characteristics by increase in a dark current. Further, in a transistor, this causes a factor which degrades current/voltage characteristics such as ON/OFF characteristics.

Furthermore, it is known that it is very effective to stack a plurality of semiconductor junction layers in increasing the efficiency of the solar cell, for example. As a measure to achieve higher efficiency, however, a technique for introducing a transparent intermediate layer between semiconductor junction layers has been recently proposed (see JP02-76266, A (1990) and JP02-76267, A (1990)).

This serves to adjust spectrum distribution (distribution dependent on a wavelength) of incident light energy among the junction layers by the existence of the transparent intermediate layer to perform more efficient photoelectric conversion.

Here, the function of the transparent intermediate layer will be simply described using FIG. 12. FIG. 12 is a diagram showing the configuration of a conventional thin film solar cell of a super-straight type in which light is incident on a substrate, having two semiconductor junction layers 31 and 32, and obtained by introducing a transparent intermediate layer 5 between the semiconductor junction layers 31 and 32 (JP04-127580, A (1992)). FIG. 13 is a band diagram of a pin-type semiconductor device in the thin film solar cell shown in FIG. 12.

On a transparent substrate 1, a front electrode 2 composed of a transparent conductive material, a semiconductor multi-layer film 3, and a rear electrode 4 are successively formed. Further, the semiconductor multi-layer film 3 is formed with a conductive transparent intermediate layer 5 having conductive properties interposed between the first semiconductor junction layers 31 and the second semiconductor junction layer 32. The semiconductor junction layer is generally composed of a photoelectric conversion cell having a pin junction. Here, the first semiconductor junction layer 31 is composed of a pin junction of a p-type layer 31a, a photoactive layer 31b of an i type, and an n-type layer 31c, and the second semiconductor junction layer 32 is composed of a pin junction of a p-type layer 32a, a photoactive layer 32b of an i type, and an n-type layer 32c.

From the viewpoint of high efficiency, a material having a large band gap energy, for example, an amorphous silicon material represented by hydrogenated amorphous silicon is generally used for the photoactive layer 31b in the first semiconductor junction layer 31 serving as a top cell positioned on the side of a light incidence surface out of the semiconductor junction layers. On the other hand, a material having small band gap energy, for example, a microcrystalline silicon or a nanocrystalline silicon is used for the photoactive layer 32b in the second semiconductor junction layer 32 serving as a bottom cell positioned on the opposite side of the light incidence surface.

If light (hv) is incident on the transparent substrate 1, the light passes through the front electrode 2, and is photoelectrically converted in the first semiconductor junction layer 31 and the second semiconductor junction layer 32, producing photovoltaic power.

Particularly, the first semiconductor junction layer 31 has high light absorption characteristics for short-wavelength light because the photoactive layer 31b includes an amorphous silicon material having large band gap energy. On the other hand, the second semiconductor junction layer 32 has high, light absorption characteristics for long-wavelength light because the photoactive layer 32b includes a microcrystalline silicon or a nanocrystalline silicon having a small band gap energy. Therefore, it is possible to perform photoelectric conversion over a wide wavelength range of incident light.

The refractive index and the film thickness of the transparent intermediate layer 5 provided between the first semiconductor junction layer 31 and the second semiconductor junction layer 32 are adjusted, thereby making it possible to more easily reflect a short wavelength component which cannot be absorbed entirely in the photoactive layer 31b in the first semiconductor junction layer 31 and more easily transmit a long wavelength component which is absorbed in the photoactive layer 32b in the second semiconductor junction layer 32 in light which has reached the transparent intermediate layer 5 after being incident from a light incidence surface to pass through the first semiconductor junction layer 31.

This allows the light-energy density of the short wavelength component to be raised in the semiconductor junction layer 31 positioned on the side of the light incidence surface with respect to the transparent intermediate layer 5, while allowing the light energy density of the long wavelength component to be raised in the semiconductor junction layer 32 positioned on the downstream side in light transmission of the transparent intermediate layer 5.

It is possible to distribute light energy corresponding to band gap energy, that is, distribute light energy in consideration of a wavelength by disposing the transparent intermediate layer 5, as described above. Therefore, efficient photoelectric conversion can be performed, thereby allowing a multi-junction type thin film solar cell device to be made highly efficient.

SUMMARY OF THE INVENTION

As described in the foregoing, in order to reduce a carrier recombination rate R in a semiconductor/electrode contact interface for degrading current/voltage characteristics of a semiconductor device, an attempt to respectively reduce a recombination center density Nr in the interface and a minority carrier density n on a surface of the interface has been made. However, there are some problems. For example, an attempt to reduce either one of the densities increases the other density. Therefore, an obtained effect has a limitation.

As a result of examination, the inventors have, found a configuration which allows a recombination center density Nr to be reduced without increasing a minority carrier density n and consequently, allows a carrier recombination rate R in a semiconductor/electrode contact interface to be effectively reduced.

An object of the present invention is to provide a semiconductor/electrode contact structure in which a carrier recombination rate R in a contact interface is reduced as well as to provide a semiconductor device whose characteristics are improved by employing the semiconductor/electrode contact structure.

In order to attain the above-mentioned object, the inventors have found that there is provided, between a semiconductor (e.g., of a p type) and an electrode, a semiconductor of the opposite conductivity type (an n-type in this example), and a carrier recombination rate in the contact interface can be effectively reduced when the semiconductor of the opposite conductivity type satisfies predetermined conditions. That is, a semiconductor/electrode contact structure according to the present invention comprises, between the semiconductor of the one conductivity type and the electrode, a semiconductor of a conductivity type opposite to that of the semiconductor of the one conductivity type.

It is preferable that the concentration of the doping element in the semiconductor of the one conductivity type and/or the semiconductor of the opposite conductivity type in a region where the semiconductors (the semiconductor of the one conductivity type and the semiconductor of the opposite conductivity type) are in contact with each other is not less than $1 \times 10^{18}/cm^3$ nor more than $5 \times 10^{21}/cm^3$ over predetermined thicknesses d1 and d2. Thus, a junction between the semiconductor of the one conductivity type and the semiconductor of the opposite conductivity type can be a tunnel junction or a junction having characteristics conforming thereto, thereby allowing good ohmic characteristics to be realized between the semiconductor and the electrode.

It is preferable that the predetermined thickness d1 is not less than the thickness of one atomic layer nor more than the total thickness of the semiconductor of the opposite conductivity type, and it is preferable that the predetermined thickness d2 is not less than the thickness of one atomic layer nor more than the total thickness of the semiconductor of the one conductivity type. Further, it is more preferable that the thickness d of the semiconductor of the opposite conductivity type is not more than 5 nm.

This allows the tunneling probability of carriers leading to the electrode from the semiconductor of the one conductivity type through the semiconductor of the opposite conductivity type to be improved and allows the ohmic characteristics between the semiconductor and the electrode to be further improved.

Furthermore, it is preferable that the semiconductor of the opposite conductivity type includes at least one element selected from a group consisting of carbon, oxygen, and nitrogen. This allows the concentration of minority carriers to be further reduced, thereby making it possible to further reduce the recombination rate in the semiconductor/electrode interface. Further, the addition of the element has the effect of enlarging the band gap of the semiconductor, thereby making it possible to also reduce a light absorption amount in the semiconductor of the opposite conductivity type.

The semiconductor of the opposite conductivity type is preferably an amorphous phase, and more preferably a microcrystalline or a nanocrystalline phase. Particularly, it is preferable that the microcrystalline phase or the nanocrystalline phase is a phase including a crystal of an indirect transition type. This configuration allows the absorption of the semiconductor to be reduced in the semiconductor of the opposite conductivity type. Consequently, it is possible to more satisfactorily realize a tunnel junction or junction characteristics conforming thereto in a inverse junction while restraining the light absorption amount in the semiconductor of the opposite conductivity type.

In the semiconductor/electrode contact structure according to the present invention, if the electrode is composed of a metal material, the present invention is applicable to not only a solar cell but also semiconductor devices in general. Particularly, the metal material has a low resistance. If the nature of the metal material is utilized, therefore, it is possible to suitably use the electrode for a collecting electrode portion on a surface of a bulk type silicon solar cell. If the electrode is composed of a transparent conductive material, light is not shaded. Therefore, the electrode can be suitably used as an electrode which transmits light particularly in a photoelectric conversion device or the like.

Furthermore, the electrode may have a two-layer structure comprising a transparent conductive material layer and a metal material layer. If the transparent conductive material layer is positioned on the side of a contact surface of the electrode with the semiconductor, it is possible to restrain the phenomenon that a metal material component composing the metal material layer is diffused into the semiconductor layer, to degrade semiconductor device characteristics.

An example of materials for the semiconductor so far described is silicon suitably used for not only the solar cell but also the semiconductor device in general.

Furthermore, the semiconductor device according to the present invention is characterized by comprising a plurality of semiconductor/electrode contacts and in that at least one of them is the semiconductor/electrode contact according to the present invention. Consequently, the semiconductor device according to the present invention has superior current/voltage characteristics (high conversion efficiency in terms of the solar cell) because it allows the recombination rate in the semiconductor/electrode contact to be reduced.

The reason why the present invention produces the foregoing function and effect is presumed as follows with respect to its principle and mechanism.

In the semiconductor/electrode contact; structure according to the present invention, there is provided, between a semiconductor (e.g., of a p type) and an electrode, a semiconductor of the opposite conductivity type (an n type in this example), and a junction between the n-type semiconductor of the opposite conductivity type and the p-type semiconductor is a tunnel junction or a junction having characteristics conforming thereto in order to realize good ohmic characteristics between the semiconductor and the electrode. The junction may be hereinafter referred to as a "inverse junction".

Here, the junction having the junction characteristics conforming to the tunnel junction refers to a case where a "area resistance value" ((V/I)×S, where S is the area of the inverse junction) in V-I characteristics of the inverse junction is not more than $1\Omega \cdot cm^2$ in a range from −0.02 V to 0.02 V of a voltage applied to the inverse junction.

For example, when the area S of the inverse junction is 1 $cm^2$, the "area resistance value" is $0.5\Omega \cdot cm^2$ if the current I of −0.04 A flowing when the applied voltage is −0.02 V, while the "area resistance value" is $0.33\Omega \cdot cm^2$ if the current I flowing when the applied voltage is +0.02V is 0.06 A. The "area resistance values" are within a required range (not more than $1\Omega \cdot cm^2$) of the junction characteristics. Therefore, it can be said that the inverse junction having such V-I characteristics is a junction having junction characteristics conforming to the tunnel junction suitable for the present invention.

FIG. 11 is a band diagram of a conventional pin-type semiconductor device shown in FIG. 10. A carrier recombination rate R in a semiconductor/electrode interface is a value proportional to the product of a minority carrier density n in the interface and a recombination center density Nr caused by an interface defect level.

On the other hand, FIG. 1 is a diagram showing the configuration of a pin-type semiconductor device to which the present invention is applied. FIG. 2 is a band diagram of the pin-type semiconductor device shown in FIG. 1. There is provided, between a p-type semiconductor $3a$ and, an electrode 2, an n-type semiconductor 6, which together with the p-type semiconductor $3a$, forms a tunnel junction or a junction having characteristics conforming thereto, and there is provided, between an n-type semiconductor $3c$ and an electrode 4, a p-type semiconductor 7 which together with the n-type semiconductor $3c$, forms a tunnel junction or a junction having characteristics conforming thereto.

In this semiconductor device to which the semiconductor/electrode contact structure with the semiconductor of the opposite conductivity type interposed between the semiconductor of the one conductivity type and the electrode is applied, a defect level density Nd in a semiconductor/electrode interface occurs, as in the conventional device. However, a recombination center density Nr at a recombination center of minority carriers corresponding to the minority carriers in the conventional pin-type semiconductor device is significantly reduced.

In the conventional configuration, the reason is that the defect level in the semiconductor/electrode interface is positioned on the side of minority carriers with respect to a Fermi level Ef (see FIG. 11), so that a large part of the defect level functions as a recombination center.

On the other hand, in the device to which the present invention is applied, the reason is that the defect level is positioned on the side of majority carriers with respect to a Fermi level Ef by interposing, between the semiconductor of the one conductivity type and the electrode, the semiconductor of the opposite conductivity type (see FIG. 2), so that a large part of the defect level does not function as a recombination center.

For electrons which are minority carriers in a p-type semiconductor layer, for example, the defect level is in a state where few electrons exist in the conventional device shown in FIG. 11. Accordingly, the recombination loss of the minority carriers occurs at a very high efficiency. On the other hand, in the device to which the present invention is applied, an interface defect level to be a counterpart of recombination corresponding to the minority carriers enters a state where it is almost filled with electrons, as shown in FIG. 2, so that the recombination loss of the minority carriers hardly occurs.

Specifically, according to the present invention, the recombination center density Nr in the semiconductor/metal contact interface can be significantly reduced, as compared with that in the conventional semiconductor device. Therefore, the recombination rate R can be significantly reduced. Thus, the device characteristics can be improved.

The recombination rate R can be thus significantly reduced to such an extent that it sufficiently exceeds a certain threshold value, thereby allowing high yield to be obtained.

The reason why the doping concentration in the inverse junction is $1 \times 10^{18} \sim 5 \times 10^{21}$ $cm^{-3}$ is that the inverse junction is a tunnel junction or a junction having junction characteristics conforming thereto. Consequently, ohmic characteristics between the semiconductor and the electrode are not degraded.

In the case of multi-junction type semiconductor device, although description was made of a case where a very superior function is obtained in an optical aspect by introducing the transparent intermediate layer between the first semiconductor junction layer and the second semiconductor junction layer, problems also frequently occur in an electrical aspect. That is, a conventional device into which the transparent intermediate layer is introduced has had problems such as degradation in characteristics and reduction in yield because the recombination of photo-generated carriers, production of a dark current component, etc. easily occur in a semiconductor/transparent intermediate layer interface. Specifically, it is difficult to realize values designed in an open circuit voltage Voc and a fill factor FF particularly in solar cell characteristics, so that an expected efficiency is not obtained. Further, the characteristics are degraded and greatly vary, so that characteristic yield cannot be raised to an expected level.

An object of the present invention is to achieve improvement in electrical characteristics of a multi-junction type semiconductor device having a transparent intermediate layer (high efficiency in a solar cell) and stability (improvement in yield).

As a result of examination, the inventors have found that a carrier recombination rate in an interface between a transparent intermediate layer having conductive properties and a semiconductor junction layer is a problem. When the carrier recombination rate is large, the recombination loss of photo-generated carriers is promoted to reduce a short-circuit current density Jsc in the interface between the transparent intermediate layer and the semiconductor junction layer, and a dark current serving as the origin of the interface is increased to reduce an open circuit voltage Voc and reduce a fill factor FF. Correspondingly, yield is also degraded.

The inventors have found that there is provided, in the interface of the transparent intermediate layer and the semiconductor junction layer, i.e., between a semiconductor junction layer (e.g., of a p type) and the transparent intermediate layer having conductive properties, a semiconductor of a conductivity type (of an n type in this example) opposite to that of the semiconductor layer, to form a pn inverse junction, so that the carrier recombination rate can be dramatically reduced.

A semiconductor device according to the present invention is a multi-junction type semiconductor device having a plurality of semiconductor junction layers each obtained by stacking semiconductor layers, and formed with a transparent intermediate layer having conductive properties interposed between at least the two adjacent semiconductor junction layers, wherein there is provided, between the semiconductor layer in at least one of the semiconductor junction layers adjacent to the transparent intermediate layer and the transparent intermediate layer, a semiconductor layer of a conductivity type opposite to that of the semiconductor layer in the semiconductor junction layer.

Between the semiconductor layer in the semiconductor junction layer and the transparent intermediate layer having conductive properties, the semiconductor of the conductivity type opposite to that of the semiconductor layer is interposed, to form a pn inverse junction. Therefore, the recombination rate of photo-generated carriers excited by incident light can be effectively reduced, and the production of a dark current component can be effectively restrained. Therefore, it is possible to improve photoelectric conversion efficiency as well as to stabilize characteristics.

If the semiconductor layers of the opposite conductivity types are respectively interposed between the semiconductor junction layers with the transparent intermediate layer interposed therebetween and the transparent intermediate layer, the reduction in the recombination rate of the photo-generated carriers and the restraint of the production of the dark current are effectively promoted in both the semiconductor junction layers, thereby more reliably exhibiting the effect of improving photoelectric conversion efficiency as well as making it possible to obtain more stable characteristics.

Furthermore, it is preferable that the concentration of a doping element in the semiconductor layer in either one or both of "contacting regions" where the semiconductor layers in the semiconductor junction layers adjacent to the transparent intermediate layer and the semiconductor layers of the opposite conductivity types are in contact with each other is not less than $1 \times 10^{18}/cm^3$ nor more than $5 \times 10^{21}/cm^3$. Thus, a pn inverse junction formed between the semiconductor layer in the semiconductor junction layer and the semiconductor layer of the opposite conductivity type can be a tunnel junction or a junction having characteristics conforming thereto, thereby allowing good ohmic characteristics to be realized between the semiconductor junction layer and the transparent intermediate layer. The above-mentioned "contacting region" is specifically a range of not less than the thickness of at least one atomic layer nor more than the thickness of the semiconductor layer in the semiconductor junction layer or the semiconductor layer of the opposite conductivity type.

Furthermore, it is desirable that the thickness of the semiconductor layer of the opposite conductivity type is not less than the thickness of one atomic layer or not more than 5 nm. Thus, a pn inverse junction formed between the semiconductor layer in the semiconductor junction layer and the semiconductor layer of the opposite conductivity type can be a tunnel junction or a junction having characteristics conforming thereto, and the tunneling probability of carriers leading to the transparent intermediate layer through the semiconductor of the opposite conductivity type joined to the semiconductor layer through the pn inverse junction can be improved, thereby allowing ohmic characteristics to be further improved between the semiconductor junction layer and the transparent intermediate layer.

It is desirable that the semiconductor layer of the opposite conductivity type includes at least one element selected from a group consisting of carbon, oxygen, and nitrogen. This allows the band gap of the semiconductor to be enlarged and allows the concentration of minority carriers to be further reduced, thereby making it possible to further reduce the recombination rate in the interface of the semiconductor layer in the semiconductor junction layer and the transparent intermediate layer. The enlargement of the band gap also reduces a light absorption amount in the semiconductor layer of the opposite conductivity type, thereby making it possible to obtain the effect of reducing a light absorption loss in the semiconductor layer of the opposite conductivity type.

It is desirable that the semiconductor layer of the opposite conductivity type includes a region for reducing the light absorption coefficient of the semiconductor, and it, is particularly desirable that the region is a phase including a crystal of an indirect transition type. This allows a tunnel junction or junction characteristics conforming thereto in a pn inverse junction between the semiconductor layer of the opposite conductivity type and the semiconductor layer to be satisfactorily realized while restraining the light absorption amount in the semiconductor of the opposite conductivity type. The above-mentioned "phase including a crystal of an indirect transition type" is an amorphous phase including a crystal phase in the semiconductor of the opposite conductivity type, for example.

If the semiconductor composing the multi-junction type semiconductor device according to the present invention is a silicon-based semiconductor, it is possible to configure a semiconductor device having a photoelectric conversion function significantly high in efficiency and superior in characteristic yield (stability of efficiency).

A principle and a mechanism upon which a function is produced by the configuration of the present invention will be presumed in the following manner from the results of experiments conducted by the inventors, although the details thereof are unclear. Although description is now made of the first semiconductor junction layer and the transparent intermediate layer, it goes without saying that the same description is true for the transparent intermediate layer and the second semiconductor junction layer.

FIG. 8 is a band diagram of a semiconductor device for explaining the present invention. FIG. 13 is a band diagram of a portion relating to a semiconductor junction layer and a transparent intermediate layer in the conventional device.

Here, a carrier recombination rate R in a semiconductor/transparent intermediate layer interface is a value proportional to the product of a minority carrier density n in an n-type layer, in the interface and a recombination center density Nr caused by an interface defect level, as given by the following expression:

$$R \propto Nr \times n$$

Although it is considered that the recombination center density Nr is exactly in a relationship of Nr<Nd with the interface defect level density Nd, there is hardly any problem even if Nr≈Nd in a range handled in the present case.

It is herein considered that the carrier recombination rate R greatly affects device characteristics. That is, when the carrier recombination rate R is large, the recombination loss of photo-generated carriers in the interface is promoted to reduce a short-circuit current density Jsc, and a dark current serving as the origin of the interface is increased to reduce an open circuit voltage Voc and reduce a fill factor FF. Correspondingly, yield is also degraded. In the conventional device, it is very difficult in terms of configuration to reduce the adverse effects.

On the other hand, in the device to which the present invention shown in FIG. 8 is applied, a p-type semiconductor 31d which together with an n-type semiconductor 31c in a semiconductor junction layer, forms a pn inverse junction is inserted between the n-type semiconductor 31c and a transparent intermediate layer 5, so that the recombination center density Nr corresponding to minority carriers in the n-type layer in the vicinity of the semiconductor/transparent intermediate layer interface is significantly reduced.

That is, the defect level density Nd itself in the semiconductor/transparent intermediate layer interface does not differ from that in the conventional device. In the conventional device, however, a defect level Ed is positioned on the side of minority carriers with respect to a Fermi level Ef, as shown in FIG. 13, so that a large part of the defect level Ed functions as a recombination center. On the other hand, in the device to which the present invention is applied, a defect level is positioned on the side of majority carriers with respect to a Fermi level Ef, as shown in FIG. 8, so that a large part of the defect level does not function as a recombination center.

In other words, for holes which are minority carriers in the n-type semiconductor layer, the defect level is almost filled with electrons in the conventional device. Therefore, the recombination of the minority carriers, that is, the recombination of the holes which are the minority carriers and electrons at the defect level occurs at a very high efficiency. On the other hand, in the device to which the present invention is applied, few electrons exist in the interface defect level serving as a counterpart of recombination corresponding to the minority carriers, so that it is considered that the recombination of the minority carriers hardly occurs.

By the above-mentioned principle and mechanism, it is presumed that the device to which the present invention is applied allows the recombination center density Nr in the semiconductor/transparent intermediate layer interface to be significantly reduced, and allows the carrier recombination rate R to be significantly reduced. Since the carrier recombination rate R can be thus significantly reduced, it is considered that the variations in the recombination rate R are restrained, thereby allowing high yield to be obtained.

In the semiconductor layer in the semiconductor junction layer and the transparent intermediate layer in the present invention, there is provided, between the semiconductor layer (e.g., of a p type) and the transparent intermediate layer, the semiconductor layer of the opposite conductivity type (of an n type in this example). In order to realize good ohmic characteristics therebetween, however, it is desirable that a pn inverse junction between the n-type semiconductor of the opposite conductivity type and the p-type semiconductor is a tunnel junction or a junction having characteristics conforming thereto.

Here, the junction having the junction characteristics conforming to the tunnel junction refers to a case where a value represented as a "area resistance value" ((V/I)×S, where S is the area of the n inverse junction) in V-I characteristics of the pn inverse junction is not more than $1\Omega\cdot cm^2$ in a range from −0.02 V to 0.02 V of a voltage applied to the pn inverse junction.

For example, when the area S of the pn inverse junction is 1 $cm^2$, the "area resistance value" is $0.5\Omega\cdot cm^2$ if the current I flowing when the applied voltage is −0.02 V is −0.04 A, while the "area resistance value" is 0.33 $\Omega\cdot cm^2$ if the current I flowing when the applied voltage is +0.02 V is 0.06 A. However, the "area resistance values" are within a required range (not more than $1\Omega\cdot cm^2$) of the junction characteristics.

Therefore, it can be said that the pn inverse junction having such V-I characteristics is a junction having junction characteristics conforming to the tunnel junction suitable for the present invention.

As described in the foregoing, according to the present invention, in the contact between the semiconductor of the one conductivity type and the electrode, it is possible to effectively reduce the recombination rate of the minority carriers in the semiconductor/electrode contact interface by interposing, between the semiconductor of the one conductivity type and the electrode, the semiconductor of the conductivity type opposite to that of the semiconductor of the one conductivity type as well as to also hold good ohmic characteristics by forming the tunnel junction and the junction having characteristics conforming thereto. When the semiconductor/electrode contact structure is applied, therefore, it is possible to rapidly improve the characteristics of the semiconductor device.

Furthermore, the recombination rate is significantly reduced in excess of a certain threshold value, thereby allowing the yield of the semiconductor device to be improved.

Particularly in the photoelectric conversion device, the recombination rate of the photo-generated carriers excited by incident light can be effectively reduced, and the dark current component can be effectively prevented from being produced, thereby allowing photoelectric conversion efficiency to be improved. The carrier recombination rate is significantly reduced in excess of a certain threshold value, so that obtained characteristics are significantly stabilized, thereby making it possible to obtain the effect of significantly improving the yield of the semiconductor device.

The foregoing and other objects, features, aspects and advantages of the present invention will become more apparent from the following detailed description of the present invention when taken in conjunction with the accompanying drawings.

DETAILED DESCRIPTION OF THE INVENTION

Embodiments of a semiconductor/electrode contact structure according to the present invention and a semiconductor device using the same will be described in detail on the basis of the drawings.

Figure 1:
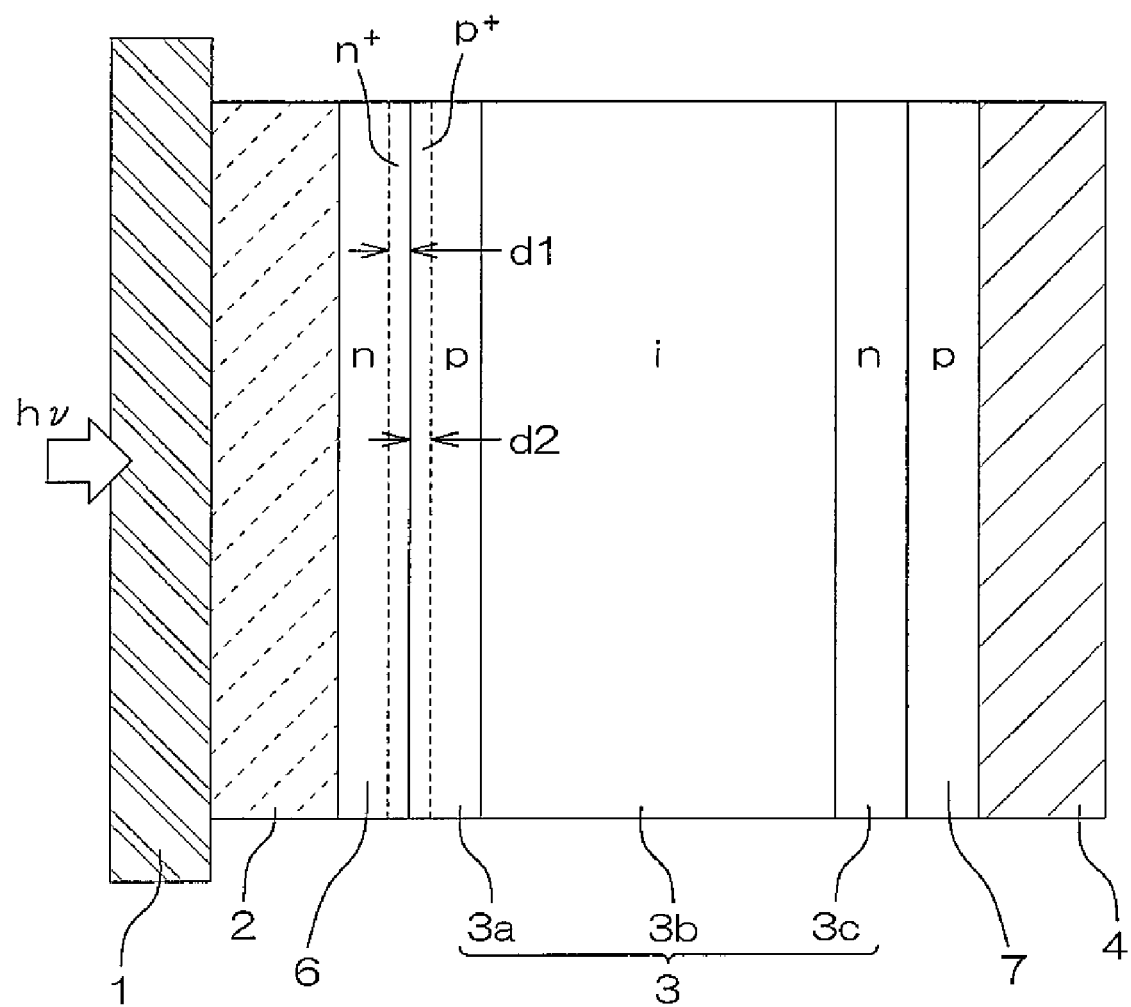
FIG. 1 is a cross-sectional view showing the configuration of a pin junction type semiconductor device to which a semiconductor/electrode contact structure according to the present invention is applied.
Figure 2:
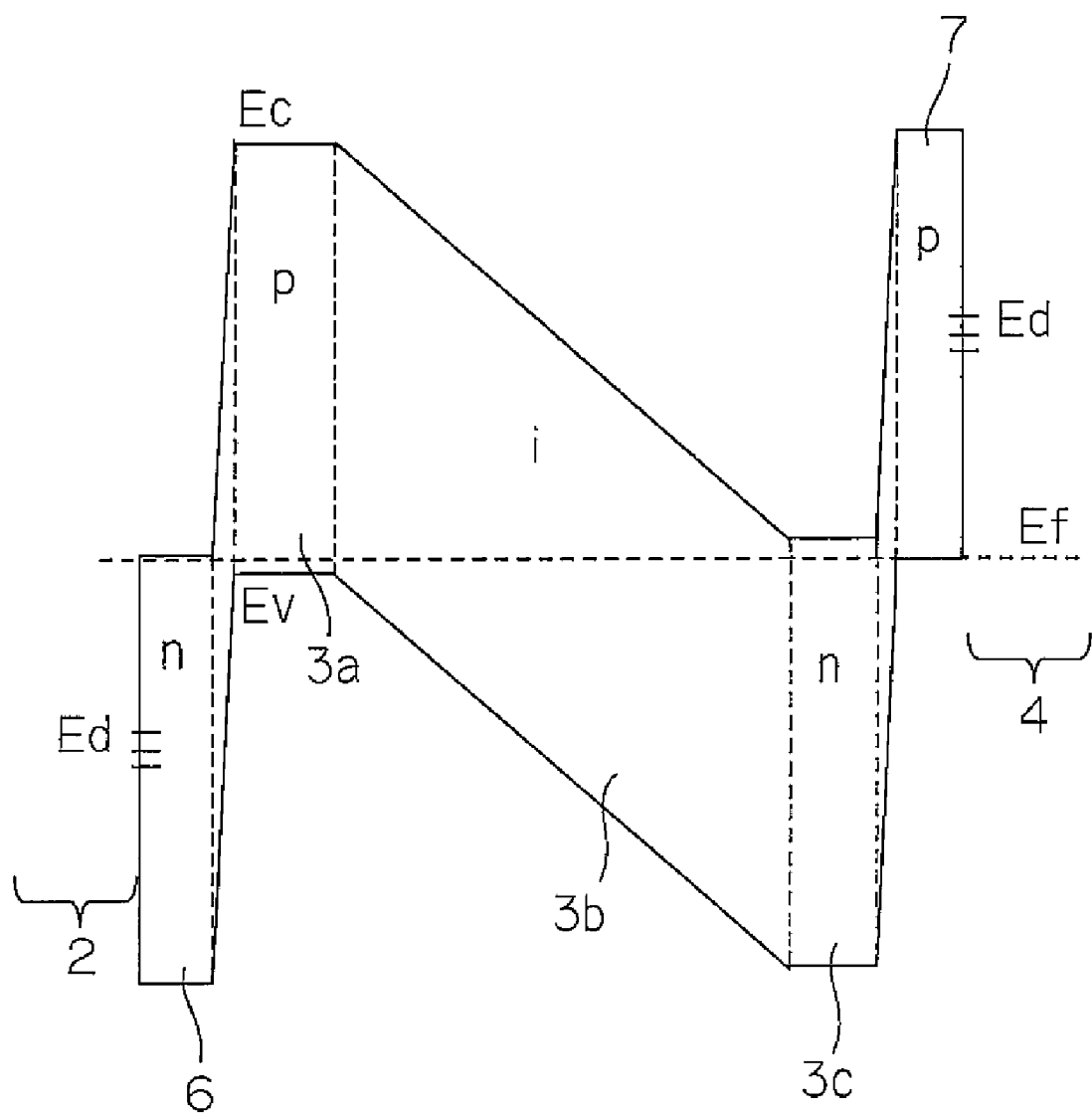
FIG. 2 is a band diagram of the pin junction type semiconductor device shown in FIG. 1.
Figure 3:
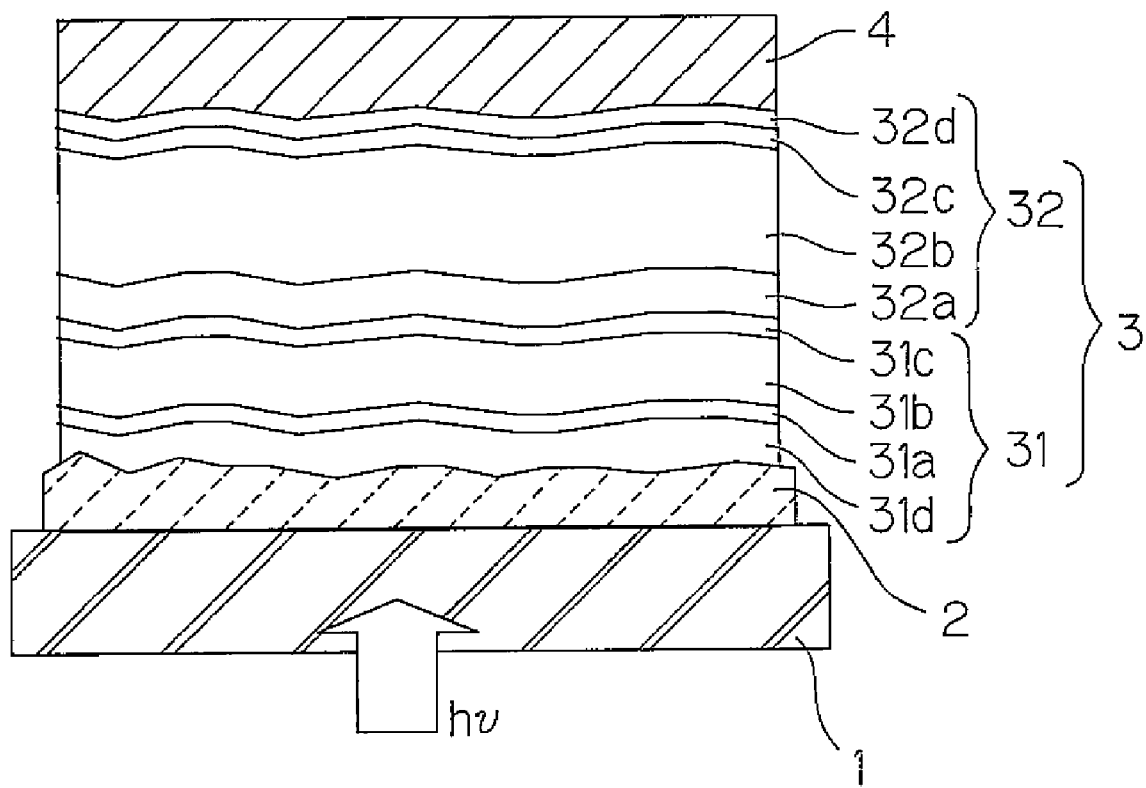
FIG. 3 is a cross-sectional view of a super-straight type thin film silicon solar cell in which light is incident on a substrate.

FIG. 3 is a cross-sectional view of a super-straight type thin film silicon solar cell in which light is incident on a substrate.

Figure 4:
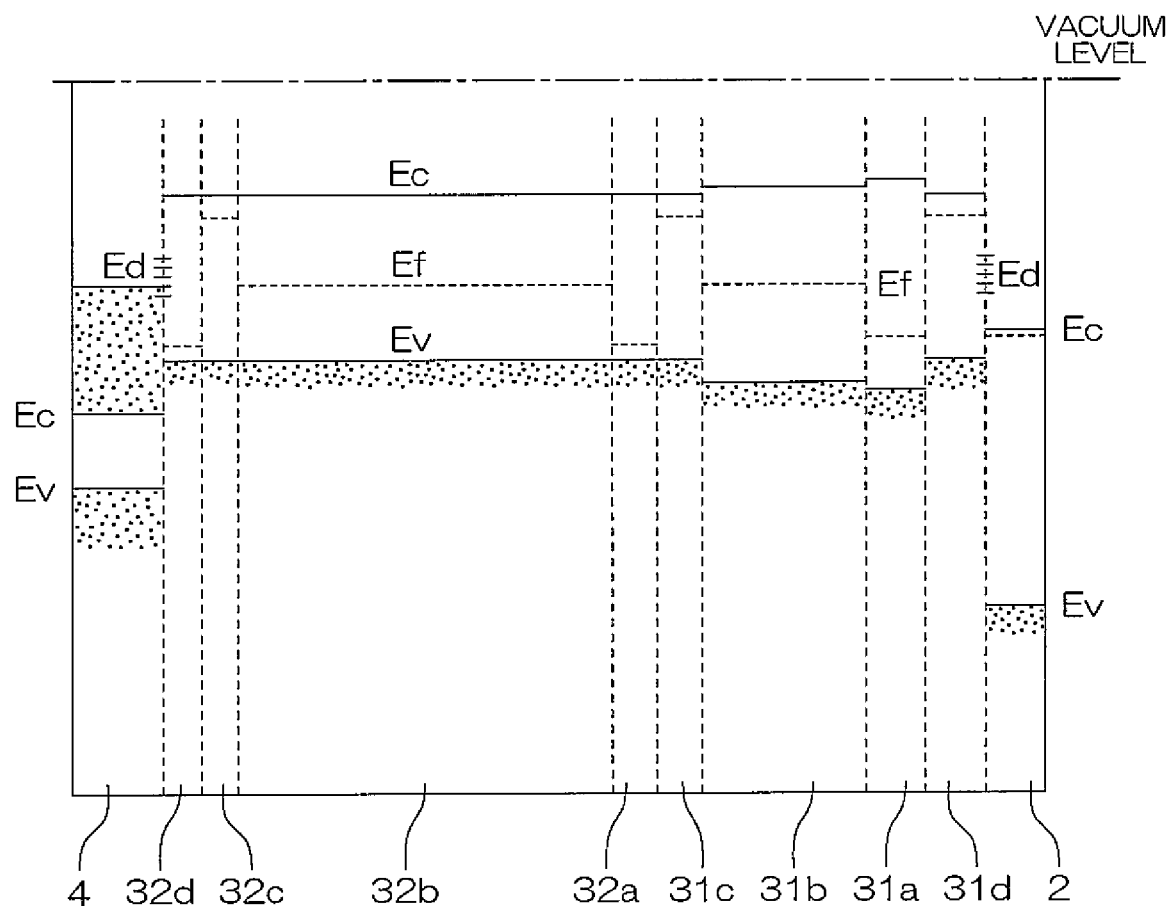
FIG. 4 is a band diagram of a state based on a vacuum level before contact where each layer of the thin film silicon solar cell in FIG. 3 exists independently.
Figure 5:
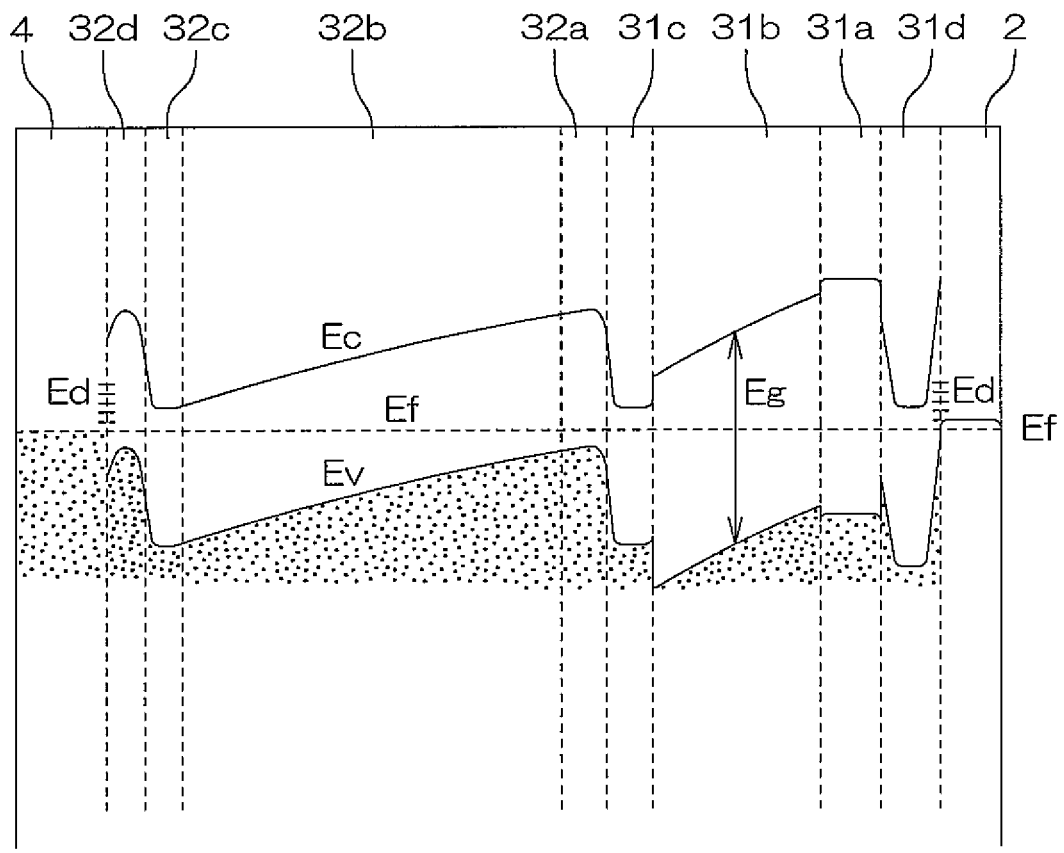
FIG. 5 is a band diagram of a state based on a Fermi level where each layer of the thin film silicon solar cell shown in FIG. 3 is in contact and in thermal equilibrium (Fermi levels of the layers are the same)

FIG. 4 is a band diagram, unified at a vacuum level, of the thin film silicon solar cell shown in FIG. 3 (a state before contact). FIG. 5 is a band diagram, unified at a Fermi level Ef, of the thin film silicon solar cell shown in FIG. 3 (a state after contact). Ec indicates a conduction band edge, and Ev indicates a valence band edge. "μc-Si:H" indicates microcrystalline silicon including an amorphous phase, and "a-Si:H" indicates a hydrogenated amorphous silicon film.

Although "μc-Si:H" or "a-Si:H" is mentioned for each layer in FIGS. 4 and 5, the use of the material is only one typical example. As described later, the material for each of the layers is not necessarily limited to that in the typical example.

In FIG. 3, reference numeral 1 denotes a transparent substrate composed of glass, reference numeral 2 denotes a first electrode, composed of a transparent conductive film, serving as a front electrode, reference numeral 3 denotes a semiconductor multi-layer film composed of an Si-based material, and reference numeral 4 denotes a second electrode, composed of a metal, serving as a rear electrode.

In the semiconductor multi-layer film 3, reference numeral 31 denotes a first semiconductor junction layer composed of an Si-based material, reference numeral 32 denotes a second semiconductor junction layer composed of an Si-based material, 31a denotes a p-type semiconductor layer 31 in the first semiconductor junction layer composed of an Si-based material, 31b denotes a photoactive layer in the first semiconductor junction layer 31 composed of an Si-based material, 31c denotes an n-type semiconductor layer in the first semiconductor junction layer 31 composed of an Si-based material, 32a denotes a p-type semiconductor layer in a second semiconductor junction layer 32 composed of an Si-based material, 32b denotes a photoactive layer in the second semiconductor junction layer 32 composed of an Si-based material, and 32c denotes an n-type semiconductor layer in the second semiconductor junction layer 32 composed of an Si-based material.

The present invention is characterized by providing, between the first electrode 2 and the p-type semiconductor layer 31a in the first semiconductor junction layer 31, the n-type semiconductor layer 31d, composed of an Si-based material, of the opposite conductivity type, and providing, between the second electrode 4 and the n-type semiconductor layer 32c in the second semiconductor junction layer 32, the p-type semiconductor layer 32d, composed of an Si-based material, of the opposite conductivity type. Each of the semiconductor layers 31d and 32d of the opposite conductivity types has a doping element concentration of $1\times10^{18} \sim 5\times10^{21}/cm^3$, and the semiconductor layer and a semiconductor layer in contact therewith form a tunnel junction or a junction having characteristics conforming thereto.

The semiconductor/electrode contact structure according to the present invention allows electrical characteristics of the first electrode 2 and the p-type semiconductor layer 31a in the first semiconductor junction layer 31 and electrical characteristics of the second electrode 4 and the n-type semiconductor layer 32c in the second semiconductor junction layer 32 to be significantly improved, as compared with that in the conventional technique.

That is, in a semiconductor/metal interface, a recombination rate of minority carriers can be significantly reduced, thereby making it possible to realize a semiconductor device having good V-I characteristics. In terms of solar cell characteristics, therefore, the problem described in "DESCRIPTION OF THE RELATED ART" is solved, thereby making it feasible to improve an open circuit voltage Voc and improve a short-circuit current density Jsc. Correspondingly, the yield can be also significantly improved.

Description is now made of the processes of forming the thin film silicon solar cell.

First, a transparent substrate is prepared as the substrate 1. Specifically, a plate material or a film material composed of materials such as glass, plastic, and resin can be used. In the case of the glass, for example, so-called soda-lime glass or borosilicate glass having a thickness of several millimeters can be used. On the other hand, in the case of the plastic or resin, the material can be selected in a range in which there is no problem in heat resistance and degassing properties in the subsequent processes.

A first electrode 2 serving as a front electrode is then formed. It is preferable that a material which has a low conductive resistance and whose characteristics are not changed for a long time period is selected as a material for the electrode. Particularly, the first electrode 2 serving as a front electrode formed in the thin film solar cell is a transparent conductive film.

Usable as the transparent conductive film are known materials such as SnO2, ITO (Indium Tin Oxide), and ZnO. Since the transparent conductive film is exposed to a hydrogen gas atmosphere due to the fact that $SiH_4$ and $H_2$ are used when an Si film is later formed on the film. Therefore, it is desirable that a ZnO film superior in reduction resistance is formed on a surface in contact with at least the Si film.

Examples of a method of forming the transparent conductive film are known techniques such as a CVD (Chemical Vapor Deposition) method, a vacuum evaporation method, an ion plating method, a sputtering method, a spraying method, and a sol-gel method. Among them, the CVD method and the sputtering method are desirable from reasons such as productivity, large-area film formation characteristics, and acquisition of high-quality films.

The film thickness of the transparent conductive film is adjusted in a range of approximately 60 to 600 nm in consideration of a reflection preventing effect and reduction in resistance. As an indication of the reduction in resistance, it is desirable that a sheet resistance is not more than approximately 10 Ω/□.

A semiconductor multi-layer film 3 composed of a silicon-based film is then formed. The semiconductor multi-layer film 3 has a structure in which a first semiconductor junction layer 31 and a second semiconductor junction layer 32 are stacked. Examples of a method of forming the silicon-based film are a PECVD (Plasma Enhanced CVD) method and a Cat-CVD (Catalytic CVD) method which have been conventionally known. If the Cat-PECVD method already disclosed by the present inventors in JP2001-313272 (A) and JP2003-173980 (A) is used, however, a high-quality film can be formed at high speed. Further, the use of the Cat-PECVD method is particularly effective for formation of a crystalline film out of films, described later, because crystallization can be promoted.

As a top cell on which light is incident, the first semiconductor junction layer 31 including a hydrogenated amorphous silicon film in its photoactive layer is first formed. Specifically, it is desirable that an n-type layer 31d, a p-type layer 31a, a photoactive layer 31b, and an n-type layer 31c are stacked in this order from the side of the substrate, and the photoactive layer 31b is of an i type (an intrinsic semiconductor).

As a bottom cell, the second semiconductor junction layer 32 including a microcrystalline silicon or a nanocrystalline silicon as its photoactive layer is then formed. Specifically, it is desirable that a p-type layer 32a, a photoactive layer 32b, an n-type layer 32c, and a p-type layer 32d are formed in this order from the side of the substrate, and the photoactive layer 32b is of an i type.

The reason why the semiconductor multi-layer film 3 is used by combining the first semiconductor junction layer 31 including the hydrogenated amorphous silicon film as the photoactive layer and the second semiconductor junction layer 32 including the microcrystalline silicon film or nanocrystalline silicon film as the photoactive layer is that short-wavelength light and long-wavelength light are photoelectrically converted efficiently, respectively, by the first semiconductor junction layer 31 serving as the top cell and the second semiconductor junction layer 32 serving as the bottom cell utilizing the fact that the hydrogenated amorphous silicon film has high light absorption characteristics for the short-wavelength light, and the microcrystalline silicon film or nanocrystalline silicon film has high light absorption characteristics for the long-wavelength light.

First, description is made of the process of producing the first semiconductor junction layer 31.

As the n-type layer 31d relating to the semiconductor/electrode contact structure according to the present invention, either the hydrogenated amorphous silicon film or the microcrystalline silicon film or nanocrystalline silicon film may be used. However, it is more preferable to use the microcrystalline silicon film or nanocrystalline silicon film. Here, a microcrystalline silicon or a nanocrystalline silicon refers to a mixture of crystalline silicon phase and hydrogenated amorphous silicon phase. The crystallization proportion defined by Raman peak ratio is about 50 to 100%, and especially 60 to 80% in a high quality film.

The reason is that the microcrystalline silicon or nanocrystalline silicon exhibits relatively low light absorption characteristics of an indirect transition type, resulting in a reduced light absorption loss, as compared with the hydrogenated amorphous silicon exhibiting high light absorption characteristics of a direct transition type. Further, the microcrystalline silicon or nanocrystalline silicon is more advantageous in forming a tunnel junction or a junction having characteristics conforming thereto between the n-type layer 31d and the p-type layer 31a, described later, because it has a narrower band gap than the hydrogenated amorphous silicon.

The microcrystalline silicon or nanocrystalline silicon need not be used over the whole n-type layer 31d. It may, in some cases, be used in only the vicinity of the interface between the n-type layer 31d and the p-type layer 31a, described later. This allows a light absorption loss in a narrow band gap region to be made as low as possible.

Here, impurities are doped into the n-type layer 31d so that the layer 31d can be of an n type. In a silicon semiconductor, P, As, Sb, etc. can be used as a doping element in order to obtain an n type. Among them, however, P is desirable.

The concentration of the doping element is made substantially as high as $1 \times 10^{18} \sim 5 \times 10^{21}/cm^3$ so that the conductivity type of the n-type layer 31d is changed into an $n^+$ type. This allows a tunnel junction or a junction having characteristics conforming thereto to be formed between the n-type layer 31d and the p-type layer 31a later formed. The doping concentration need not be realized over the whole n-type layer 31d. It may be realized in a region in contact with at least the p-type layer 31a. The film thickness d1 of the $n^+$ layer may be realized in a range of not less than the thickness of at least one atomic layer nor more than the film thickness of the n-type layer 31d.

The film thickness d1 of the $n^+$ layer may be not more than approximately 20 nm, and more preferably not more than 10 nm. The film thickness is thus set, to make a light absorption loss and a resistance loss in the layer as low as possible. More preferably, the film thickness d1 is not more than 5 nm. This allows the light absorption loss to be reduced, allows carriers to easily tunnel through the $n^+$ layer, and allows the resistance loss caused by the n-type layer 31d to be approximately zero. Consequently, it is possible to obtain a semiconductor/electrode contact at which ohmic characteristics are hardly degraded.

Examples of raw materials for forming the n-type layer 31d are $SiH_4$, $H_2$, and $PH_3$ serving as a doping gas. Here, P is acquired in the layer in rough proportion to a partial pressure ratio of $PH_3$ to $SiH_4$. By adjusting a partial pressure ratio (specifically, a gas flow ratio) corresponding to a target doping concentration, therefore, a desired doping concentration can be realized. The film thickness can be set if the film formation speed and the film formation time are adjusted. Particularly in order to crystallize the n-type layer 31d, in a substrate temperature range of approximately 100 to 400° C. in which a surface of the layer can be coated with hydrogen, the crystallization is easily feasible by setting a plasma excitation frequency to a VHF region of not less than approximately 40 MHz, for example, or positively performing gas heating.

If a gas containing C (carbon) such as $CH_4$ is mixed in a suitable amount in addition to the foregoing gases, an $Si_xC_{1-x}$ film is obtained. The band gap of the $Si_xC_{1-x}$ film is enlarged. The light absorption loss is reduced by an effect of the enlargement, thereby allowing transparency to be increased. This is very effective for formation of a so-called window layer, and is also effective for reduction in a dark current component for improving an open circuit voltage.

If the content of C is set to approximately 5 to 20%, an enlargement amount of the band gap can be approximately 0.1 to 0.3 eV. The content of C in the layer can be set to a desired value if plasma power is adjusted in consideration of a partial pressure ratio (i.e., a gas flow-ratio) of $CH_4$ to $SiH_4$ during film formation and the difference in decomposition efficiency between $CH_4$ and $SiH_4$. Further, if a gas containing O (oxygen) and a gas containing N (nitrogen) are respectively mixed in suitable amounts, an $Si_xO_{1-x}$ film and an $Si_xN_{1-x}$ film can be obtained, thereby allowing the same effect to be obtained. The gases may be mixed.

The p-type layer 31a is then formed on the n-type layer 31d. As to the p-type layer 31a, a hydrogenated amorphous silicon film, a microcrystalline silicon film or a nanocrystalline silicon film, etc. can be used. In order to form a tunnel junction or a junction having characteristics conforming thereto between the p-type layer 31a and the n-type layer 31d, it is more preferable to use the microcrystalline silicon film or nanocrystalline silicon film having a small band gap. Of course, a microcrystalline silicon or a nanocrystalline silicon need not be used over the whole p-type layer 31a. It may, in some cases, be used in only the vicinity of the interface between the p-type layer 31a and the n-type layer 31d. This allows a light absorption loss in a narrow band gap region to be made as low as possible.

Here, impurities are doped into the layer 31a so that the layer 31a can be of a p type. In a silicon semiconductor, B, Al, Ga, etc. can be used as a doping element in order to obtain a p type. Among them, however, B is desirable.

The concentration of the doping element is set to approximately $1\times10^{18}$~$5\times10^{21}$/cm$^3$. Consequently, the conductivity type of the P-type layer 31a is changed into a P$^+$ type. The doping concentration need not be realized over the whole p-type layer 31a. It may be realized in a region in contact with at least the n-type layer 31d. The film thickness d2 of the p$^+$ layer may be realized in a range of not less than the thickness of at least one atomic layer nor more than the film thickness of the p-type layer 31a.

The film thickness d2 of the p$^+$ region is adjusted in a range of approximately 2 to 100 nm depending on a material. For example, the film thickness d2' is in a range of approximately 2 to nm particularly in consideration of reduction in the light absorption loss when the hydrogenated amorphous silicon material is used, while being in a range of approximately 10 to 100 nm in consideration of reduction in junction formation capability when the microcrystalline silicon or nanocrystalline silicon is used.

If a gas containing C (carbon) such as CH$_4$ is mixed in a suitable amount in addition to gases such as SiH$_4$, H$_2$, and B$_2$H$_6$ serving as a doping gas which are used at the time of film formation, an Si$_x$C$_{1-x}$ film is obtained. The Si$_x$C$_{1-x}$ film is very effective for window layer formation having a low light absorption loss. Further, it is also effective for reduction in a dark current component for improving an open circuit voltage. Further, the same effect can be obtained even by mixing a gas containing O (oxygen) or a gas containing N (nitrogen) in a suitable amount. Here, the preferable content of C and a method of realizing the same are approximately the same as those in the above-mentioned case of the n-type semiconductor layer 31d and hence, the description thereof is not repeated.

The photoactive layer 31b serving as a non-doped layer which is not doped is then formed on the p-type 31a. A hydrogenated amorphous silicon film is used for the photoactive layer 31b. In practice, the non-doped layer usually, exhibits somewhat n-type characteristics. In this case, therefore, the photoactive layer 31b can be so adjusted that as to be substantially of an i type by including a p-type doping element in a small amount.

In order to match currents between the top cell (the first semiconductor junction layer 31) and the bottom cell (the second semiconductor junction layer 32), described later, at the same time incident light is photo-electrically converted efficiently, the film thickness of the photoactive layer 31b is adjusted in a range of approximately 0.1 to 0.5 µm.

Description is herein made of a method of forming the hydrogenated amorphous silicon film. Although the PECVD method and the Cat-CVD method which have been conventionally known can be also used, a high-quality hydrogenated amorphous silicon film can be formed at high speed and in a large area and with high productivity if the Cat-PECVD method is used. Consequently, the method is particularly effective for manufacture of a high-efficiency and low-cost thin film silicon solar cell.

Furthermore, the Cat-PECVD method allows an in-film hydrogen concentration to be not more than atomic % by an effect of promoting the formation of atomic hydrogen or an effect of gas heating. A film having a low hydrogen concentration is preferably not more than 10 atomic %, which is difficult to realize in the conventional PECVD method, or more preferably not more than 5 atomic %. Therefore, it is possible to reduce the degree of degradation by light which is a longstanding problem of a device utilizing a hydrogenated amorphous silicon film.

The n-type layer 31c is then formed on the photoactive layer 31b. As to the n-type layer 31c, a hydrogenated amorphous silicon film or a microcrystalline silicon film or a nanocrystalline silicon film can be used, and the film thickness thereof is adjusted in a range of approximately 2 to 100 nm depending on a material. For example, the film thickness is in a range of approximately 2 to 20 nm particularly in consideration of reduction in the light absorption loss when a hydrogenated amorphous silicon material is used, while being in a range of approximately 10 to 100 nm in consideration of reduction in junction formation capability when a microcrystalline silicon or a nanocrystalline silicon is used.

The concentration of the doping element is approximately $1\times10^{18}$~$5\times10^{21}$/cm$^3$ so that the conductivity type of the n-type layer 31c is changed into an n$^+$ type.

If a gas containing C (carbon) such as CH$_4$ is mixed in a suitable amount in addition to gases such as SiH$_4$, H$_2$, and PH$_3$ serving as a doping gas which are used at the time of film formation, an Si$_x$C$_{1-x}$ film is obtained, which allows film formation having a low light absorption loss, and is also effective for reduction in a dark current component for improving an open circuit voltage. Further, the same effect can be obtained even by mixing a gas containing O (oxygen) or a gas containing N (nitrogen) in a suitable amount.

In order to further improve junction characteristics, an amorphous Si layer which is substantially of an i type and an amorphous Si$_x$C$_{1-x}$ layer may be respectively inserted as buffer layers between the p-type layer 31a and the photoactive layer 31b and between the photoactive layer 31b and the n-type layer 31c. The thickness of the layer to be inserted in this case is approximately 0.5 to 50 nm. When the in-film hydrogen concentration and the C concentration are inclined so that the layer to be inserted can be a so-called graded layer in this case, a recombination rate in a region where the graded layer is formed can be reduced, which is more preferable in terms of improvement in characteristics.

Here, as to the n-type layer 31c and the p-type layer 32a which are a junction between the first semiconductor junction layer 31, described above, and the second semiconductor junction layer 32, described later, it is preferable that a tunnel junction or a junction having characteristics conforming thereto is also formed in order to realize good ohmic characteristics. A method of the realization is the same as the method realized between the n-type layer 31d and the p-type layer 31a, already described. Further, as to a contact between the n-type layer 31c and the p-type layer 32a, it is desirable that each of the layers is a microcrystalline silicon layer or a nanocrystalline silicon layer, as already described with respect to the n-type layer 31d and the p-type layer 31a.

By the above-mentioned method, the first semiconductor junction layer 31 can be formed as a top cell. Further, the second semiconductor junction layer 32 is stacked thereon as a bottom cell. However, the description of a portion which can be formed in the same method as the method of forming the first semiconductor junction layer 31 is omitted, to describe a characteristic portion.

In the present invention, in the second semiconductor junction layer 32, the n-type layer 32c and the p-type layer 32d realize the semiconductor/electrode contact structure according to the present invention.

As the second semiconductor junction layer 32, the p-type layer 32a is first formed on the first semiconductor junction layer 31. The p-type layer 32a can use a hydrogenated amorphous silicon film or a microcrystalline silicon film or a nanocrystalline silicon film, similarly to the above-mentioned p-type layer 31a in the first semiconductor junction layer 31. The detailed conditions such as the thickness and the doping concentration are the same as the foregoing conditions and hence, the description thereof is not repeated.

The photoactive layer 32b serving as a non-doped layer which is not doped is then formed on the p-type 32a. Although the photoactive layer 31b is formed of a hydrogenated amorphous silicon film in the first semiconductor junction layer 31, the photoactive layer 32b in the second semiconductor junction layer 32 is formed of a microcrystalline silicon film or a nanocrystalline silicon film.

In practice, the non-doped silicon film usually exhibits somewhat n-type characteristics. In this case, therefore, the photoactive layer 32b can be so adjusted as to be substantially of an i type by including a p-type doping element in a small amount.

In order to match currents between the top cell and the bottom cell at the same time incident light is photoelectrically converted efficiently, the film thickness of the photoactive layer 32b is adjusted in a range of approximately 1 to 3 μm.

Furthermore, although it is desirable that as the film structure of the photoactive layer 32b, the shape of its surface after film formation has an autonomous textured structure (microroughness) suitable for light confinement as a set of columnar crystal, grains in the orientation of a (110) plane in a crystal plane, which occurs as a result of preferential growth of the (110) plane, the use of the PECVD method or the Cat-PECVD method has the advantage that the structure can be naturally formed.

Although the PECVD method and the Cat-CVD method which have been conventionally known can be also used as a method of forming a microcrystalline silicon film or a nanocrystalline silicon film, a particularly high-quality microcrystalline silicon film or nanocrystalline silicon film can be formed at high speed and in a large area and with high productivity if the Cat-PECVD method is used. Consequently, the method is particularly effective for manufacture of a high-efficiency and low-cost thin film silicon solar cell.

The Cat-PECVD method allows a microcrystalline silicon film or a nanocrystalline silicon film having an in-film hydrogen concentration of not more than 10 atomic % to be obtained by an effect of promoting the formation of atomic hydrogen or an effect of gas heating. And it is possible to obtain a film having a low hydrogen concentration of preferably not more than 5 atomic % or more preferably not more than 3.5 atomic %.

The reason why the film having a low hydrogen concentration is preferable is as follows. In the case of the microcrystalline silicon film or nanocrystalline silicon film, a large part of hydrogen exists in a crystal grain boundary. Since a bonded state of hydrogen and Si and its density are proportional to an inverse number of a carrier recombination rate in the crystal grain boundary, the bonded state of hydrogen and Si and the density determine the quality of the crystal grain boundary. That is, the higher the density of an $SiH_2$ bond in a state where one Si atom which exists in the crystal grain boundary is bonded to two H atoms and other two Si atoms is, the more easily a so-called post-oxidation phenomenon (when a film is exposed to an atmosphere after film formation, a gas component including oxygen, such as $O_2$, $CO_2$, or $H_2O$, in the atmosphere is diffused into the crystal grain boundary in the film, adsorbed, and oxidized, to change a bonded state in the crystal grain boundary) occurs, thereby bringing about degradation with time in the quality of the whole film (i.e., degradation with time in characteristics) caused by degradation in the quality of the crystal grain boundary. Here, as the in-film hydrogen concentration decreases, the density of the $SiH_2$ bond in the crystal grain boundary decreases, thereby allowing a degradation phenomenon with time caused by the above-mentioned post-oxidation phenomenon to be reduced.

Specifically, a degradation ratio with time can be suppressed to not more than several percents when the in-film hydrogen concentration is not more than 5 atomic %, and can be further reduced to approximately zero when the in-film hydrogen concentration is not more than 3.5, atomic %. As a result, it is possible to manufacture a higher-efficiency solar cell.

The n-type layer 32c is then formed on the photoactive layer 32b. The n-type layer 32c can use a hydrogenated amorphous silicon film or a microcrystalline silicon film or a nanocrystalline silicon film, similarly to the above-mentioned n-type layer 31c in the first semiconductor junction layer 31. The detailed conditions such as the thickness and the doping concentration are approximately the same as the foregoing conditions and hence, the description thereof is not repeated.

In order to further improve junction characteristics, an amorphous silicon layer which is substantially of an i type may be inserted between the p-type layer 32a and the photoactive layer 32b or between the photoactive layer 32b and the n-type layer 32c. The thickness of the layer to be inserted in this case is approximately 0.5 to 50 nm.

The p-type layer 32d according to the present invention is then formed. The layer 32d can use a hydrogenated amorphous silicon film or a microcrystalline silicon film or a nanocrystalline silicon film, similarly to the above-mentioned n-type layer 31d in the first semiconductor junction layer 31. The p-type layer 32d is the same as the n-type layer 31d in the detailed conditions such as the thickness and the doping concentration except that B, Al, Ga, etc. exhibiting p-type conductivity are used as only a doping element and hence, the detailed description thereof is omitted.

Finally, a metal film is formed as the second electrode 4 serving as a rear electrode. Preferably used as materials for the metal film are ones mainly composed of Al, Ag, etc. superior in conductive properties and light reflection properties. By using the metal materials, long-wavelength light which has reached the rear electrode can be effectively incident again on the semiconductor layer by being reflected at a high index of reflection.

As a method of forming the metal film, known techniques such as a vacuum evaporation method, a sputtering method, an ion plating method, and a screen printing method can be used. Among them, the sputtering method is desirable from reasons such as productivity, large-area film formation characteristics, and acquisition of high-quality films. Further, it is desirable that the thickness of the metal film is not less than 0.1 μm in order to sufficiently reduce an electrical resistance, and is not more than 1 μm in order to avoid increase in cost.

It is more preferable that the inside of the second electrode 4 has a structure in which the transparent conductive film and the metal film are stacked in this order from the side of its surface in contact with the semiconductor layer. The reason for this is that it is possible to restrain the phenomenon that by inserting the transparent conductive film between the semiconductor layer and the metal film, a metal film component is diffused into the semiconductor layer to degrade device characteristics.

At the time of forming the transparent conductive film, light can be effectively diffused if its surface is made to have a suitable textured structure (micro-roughness), thereby making it possible to promote an effect of light confinement effective for improvement in the efficiency of the solar cell. Such a textured structure (micro-roughness) can be formed by conditions at the time of film formation and etching processing after film formation, to make adjustment such that the maximum height Rmax of unevenness of the interface between the transparent conductive film and the metal film is not less than 0.05 μm.

Examples of materials for the transparent conductive film are SnO2, ITO, and ZnO. However, ZnO is desirable from reasons such as ease of formation at low temperature, stability, ease of realization of a textured structure (micro-roughness). Further, it is desirable that the metal film to be stacked is Ag in this case.

Examples of a method of forming the transparent conductive film are known techniques such as a CVD method, a vacuum evaporation method, an ion plating method, a sputtering method, a spraying method, and a sol-gel method. Among them, the sputtering method is desirable from reasons such as productivity, large-area film formation characteristics, and acquisition of high-quality films.

By the above-mentioned method, the thin film silicon solar cell to which the present invention is applied can be realized.

Although description was made of the solar cell in which the semiconductor/electrode contact structure according to the present invention is applied to both sides of the first electrode and the second electrode in the semiconductor multi-layer film, it goes without saying that the effect of the present invention is obtained even when it is applied to only on the side of the first electrode or the side of the second electrode.

Although description was made of a tandem type solar cell in which there are two semiconductor junctions in the semiconductor multi-layer film, the same effect is obtained even in a single junction type solar cell (not shown) having one semiconductor junction, a triple junction type solar cell (not shown) having three semiconductor junctions, and a multi-junction type solar cell (not shown) having more semiconductor junctions.

Although description was made of a solar cell having a structure in which different semiconductor junction layers (a first semiconductor junction layer and a second semiconductor junction layer) are in direct contact with each other, the present invention is not limited to the same. For example, the same effect is also obtained with respect to a solar cell (not shown) having a structure in which a transparent conductive film, a very thin metal film, or an alloy film with Si is inserted as an intermediate layer between different semiconductor junction layers. The solar cell in which the transparent conductive film is provided between the different semiconductor junction layers will be described later with reference to the drawings.

Although description was made of the solar cell in which the semiconductor junction layers pin are formed in this order from the side of a light receiving surface, the same effect is obtained with respect to a solar cell in which semiconductor junction layers pin are formed in the opposite order from the side of a light receiving surface.

Although description was made of the super-straight type solar cell in which light is incident on the substrate, the same effect is obtained with respect to a substrate type solar cell in which light is incident on a semiconductor film. In the case of the substrate type solar cell, a substrate is not limited to a transparent substrate. For example, an opaque substrate composed of stainless or the like may be used. In this case, it is desirable that the first electrode is composed of a metal material, and the second electrode is a transparent material.

Figure 6:
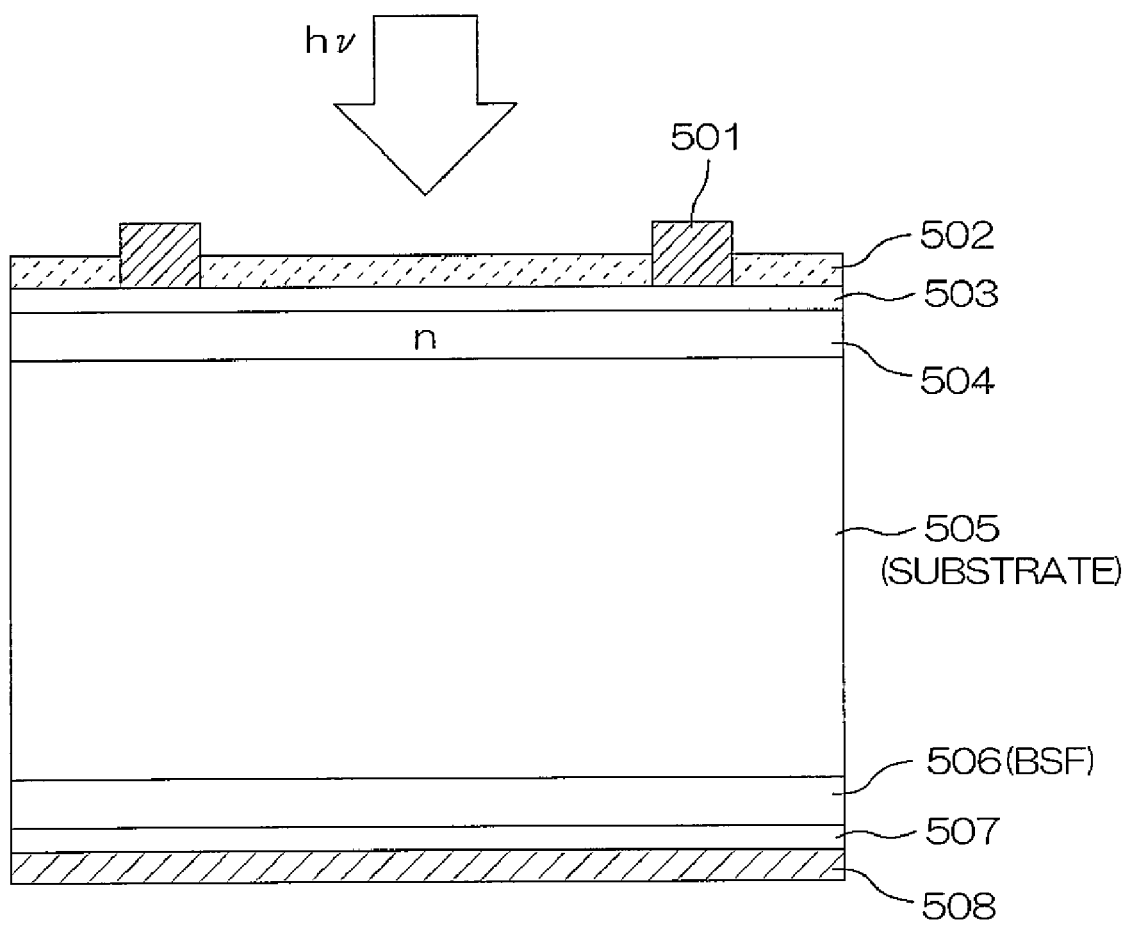
FIG. 6 is a sectional view of a bulk-type silicon solar cell to which the present invention is applied.

FIG. 6 illustrates a bulk-type silicon solar cell to which the present invention is applied. In FIG. 6, reference numeral 501 denotes a front electrode, reference numeral 502 denotes, an antireflection film, reference numeral 503 denotes a p-type Si region, reference numeral 504 denotes an n-type Si region, reference numeral 505 denotes a p-type Si photoactive region, reference numeral 506 denotes a p-type Si-BSF region, reference numeral 507 denotes an n-type Si region, and 508 denotes a rear electrode.

The present invention is characterized by providing, between the front electrode 501 and the n-type Si region 504, the p-type Si region 503 serving as a semiconductor layer of the opposite conductivity type, and providing, between the rear electrode 508 and the p-type Si-BSF region 506, the n-type Si region 507 serving as a semiconductor of the opposite conductivity type. Each of the semiconductor layers of the opposite conductivity types has a doping element concentration of $1 \times 10^{18} \sim 5 \times 10^{21}/cm^3$, and the semiconductor and a semiconductor region in contact therewith form a tunnel junction or a junction having characteristics conforming thereto.

Light is incident on the antireflection film 502, and is absorbed and photoelectrically converted in the Si region, to generate an electron-hole pair. In the case of a pn junction type as in the illustrative example, light is absorbed and photoelectrically converted particularly in the p-type Si photoactive region 505 serving as a photoactive layer. The electron-hole pair generated by the photoelectric conversion is the origin of photovoltaic power. The detailed principle of producing the production of the photovoltaic power is the same as that in the above-mentioned case of the thin film silicon solar cell and hence, the description thereof is not repeated.

Description is now made of the processes of forming the bulk-type silicon solar cell according to the present invention shown in FIG. 6.

First, a p-type Si substrate is prepared. In FIG. 6, at least the p-type Si photoactive region 505 is included in the substrate. B is preferably used as a p-type doping element in the p-type Si photoactive region 505, and the concentration thereof is approximately $1 \times 10^{16} \sim 1 \times 10^{17}/cm^3$ (the specific resistance value of the substrate in this case is approximately 0.2 to 2Ω·cm).

The thickness of the substrate is preferably not more than 500 μm, and more preferably not more than 350 μm. Examples of the substrate are a single crystalline Si substrate obtained by slicing a single crystalline Si ingot produced by methods such as a CZ (Czochralski) method and an FZ (Floating-Zone) method and a multi-crystalline Si substrate obtained by slicing a multi-crystalline Si ingot by a casting method. In the doping, a single doping element may be included in a suitable amount at the time of producing the Si ingot, or an Si mass containing B whose doping concentration has already been found may be included in a suitable amount.

The n-type Si region 504 is then formed on the p-type Si region 505. P is preferably used as an n-type doping element, and the doping concentration thereof is approximately $1 \times 10^{18} \sim 5 \times 10^{21}/cm^3$ (i.e., the conductivity type of the n-type Si region 504 is changed into $n^+$ type). Consequently, a pn junction is formed between the n-type Si region 504 and the above-mentioned p-type Si region 505.

As a method of producing the n-type Si region 504, a doping element is diffused into a surface region of the p-type Si substrate 505 at a temperature of 700 to 1000° C. by using a thermal diffusion method using POCl$_3$ (phosphorous oxychloride) as a diffusion source. In this case, the thickness of a diffusion layer is approximately 0.2 to 0.5 μm, which is changed to a desired thickness by adjusting the diffusion temperature and the diffusion time.

In a normal diffusion method, a diffusion region is also formed on a surface opposite to a target surface. An unnecessary portion where the diffusion region is formed may be later etched away. Alternatively, when a BSF layer on a back surface is formed of an Al paste, as described later, Al serving as a p-type dopant can be diffused to a sufficient depth at a sufficient concentration. Therefore, the effect of an n-t-ype diffusion layer in a shallow region where Al has already been diffused can be ignored.

A method of forming the n-type Si region 504 is not limited to the thermal diffusion method. For example, a hydrogenated amorphous silicon film, a microcrystalline silicon film or a nanocrystalline silicon film, etc. may be formed at a substrate temperature of not more than approximately 400° C. using a thin film technique and thin film conditions, as described in FIG. 3, for example.

When the n-type Si region 504 is formed using the hydrogenated amorphous silicon film, the thickness thereof is not more than 50 nm, and is preferably not more than 20 nm. When it is formed using the microcrystalline silicon film or nanocrystalline silicon film, the thickness thereof is not more than 500 nm, and is preferably not more than 200 nm.

In this case, when an i type Si region (not shown) is formed to a thickness of not more than nm between the p-type Si region 505 and the n-type Si region 504, this is effective for improvement in characteristics. When it is formed using the thin film technique, however, the order of formation must be determined, in consideration of the temperature in each of processes, described later, such that the process temperature decreases toward the succeeding stage.

The p-type Si-BSF region 506 is then formed. B and Al can be used as a p-type doping element, and the concentration of the doping element is approximately $1 \times 10^{18} \sim 5 \times 10^{21}/cm^3$ (i.e., the conductivity type of the p-type Si-BSF region 506 is changed into a p$^+$ type). This allows a Low-High junction to be formed between the p-type Si photoactive region 505 and the p-type Si-BSF region 506.

As a method of producing the BSF region 506, the BSF region 506 can be formed at a temperature of 800 to 1100° C. by using a thermal diffusion method using BBr$_3$ as a diffusion source; Particularly in the case of Al, a method of applying an Al paste composed of an Al powder and a glass frit, an organic solvent, a binder, etc. using a printing method, followed by heat treatment (firing) at a temperature of approximately 700 to 850° C. to diffuse Al can be used (referred to as a paste printing and firing method in the present specification). This method is significantly advantageous for reduction in cost. When the p-type Si-BSF region 506 (on the rear side) is formed by the thermal diffusion method, a diffusion barrier composed of an oxide film or the like is previously formed on the n-type Si region 504 (on the front side) already formed. When the paste printing and firing method is used, it is possible to not only form a desired diffusion layer only on a printing surface but also eliminate the necessity of removing an n-type layer also formed on the back surface at the same time the n-type Si region 504 is formed, as already described.

A method of forming the p-type Si region 506 is not limited to the thermal diffusion method and the paste printing and firing method. For example, a hydrogenated amorphous silicon film, a microcrystalline silicon film or a nanocrystalline silicon film, etc. may be formed at a substrate temperature of not more than approximately 400° C. using a thin film technique and conditions as described in FIG. 3, for example. In this case, the film thickness of the p-type Si region 506 is approximately 10 to 200 nm. In this case, when an i type Si region (not shown) is formed to a thickness of not more than nm between the p-type Si region 505 and the n-type Si region 504, this is effective for improvement in characteristics. When it is formed using the thin film technique, however, the order of formation must be determined, in consideration of the temperature in each of processes, described later, such that the process temperature decreases toward the succeeding stage.

The semiconductor/electrode contact structure according to the present invention on the front side is then formed. The p-type Si region 503 is formed on the n-type Si region 504, described above, before the front electrode 501 is formed. In this case, a tunnel junction or a junction having junction characteristics conforming thereto is formed under the following conditions.

B is preferably used as a p-type doping element in the p-type Si region 503. The concentration of B is set to approximately $1 \times 10^{18} \sim 5 \times 10^{21}/cm^3$ (i.e., the conductivity type of the p-type Si region 503 is changed into a p$^+$ type). The p-type Si region 503 is thus doped at a high concentration, thereby forming a junction having tunnel junction characteristics or characteristics conforming thereto between the p-type Si region 503 and the n-type Si region 504 which is similarly doped at a high concentration.

In this case, the doping concentration need not be realized over the whole p-type Si region 503. It may be realized in a region in contact with at least the n-type Si region 504 and specifically, in a range of not less than the thickness of at least one atomic layer nor more than the thickness of the region 503.

If the thickness of the p-type Si region 503 is not more than approximately 50 nm and more preferably not more than 20 nm, it is possible to make a light absorption loss and a resistance loss in the layer as low as possible. If the thickness is more preferably not more than 5 nm, allowing carriers to be easily tunneled through the p-type Si region 503 itself, the resistance loss caused by the p-type Si region 503 can be reduced to approximately zero, thereby making it possible to obtain a semiconductor/electrode contact at which ohmic characteristics are hardly degraded.

As a method of producing the p-type Si region 503, the p-type Si region 503 can be also formed at a temperature of approximately 800 to 1000° C. by using a thermal diffusion method using BBr$_3$ as a diffusion source. In order not to degrade junction characteristics formed before the process, however, it is preferable that in the process, a hydrogenated amorphous silicon film or a microcrystalline silicon film or a nanocrystalline silicon film is formed at a substrate temperature of not more than approximately 400° C. particularly using the thin film technique and conditions as described in FIG. 3. If the n-type Si region 504 is formed using the thin film technique, it must be formed similarly using the thin film technique in the process.

Although description was made of a case where the p-type Si region 503 is formed on the whole n-type Si region 504, it need not be necessarily formed over its whole surface. The p-type Si region 503 may have an area which is as small as possible on the condition that it is formed immediately under at least the front electrode 501, described later. If the area of the p-type Si region 503 is made as small as possible, an incident light absorption loss in the p-type Si region 503 can be reduced. When the p-type Si region 503 is partially formed, it is also feasible to pattern the region using a suitable mask, and it is possible to form the region using etching.

Then, the semiconductor/electrode contact structure according to the present invention on the rear side of the p-type Si region 505 will be described.

Before the rear electrode 508 is formed on the p-type Si-BSF region 506, the n-type Si region 507 is interposed between the regions. In this case, a tunnel junction or a junction having junction characteristics conforming thereto is formed under the following conditions.

P is preferably used as an n-type doping element in the n-type Si region 507. The doping concentration is approximately $1 \times 10^{18} \sim 5 \times 10^{21}/cm^3$ (i.e., the conductivity type of the n-type Si region 507 is changed into an n+ type). The n-type Si region 507 is thus doped at a high concentration, thereby forming a junction having tunnel junction characteristics or characteristics conforming thereto between the n-type Si region 507 and the p-type Si-BSF region 506 which is similarly doped at a high concentration.

In this case, the doping concentration of the n-type doping element need not be realized over 506 the whole n-type Si region 507. It may be realized in a region in contact with at least the p-type Si-BSF region 506 and specifically, in a range of not less than the thickness of at least one atomic layer nor more than the thickness of the n-type Si region 507.

Here, the thickness of the n-type Si region 507 may be not more than approximately 50 nm and more preferably not more than 20 nm, to make a light absorption loss and a resistance loss in the layer as low as possible. If the thickness is more preferably not more than 5 nm, allowing carriers to tunnel through the n-type Si region 507 itself, a resistance loss caused by the n-type Si region 507 can be reduced to approximately zero, thereby making it possible to obtain a semiconductor/electrode contact at which ohmic characteristics are hardly degraded.

As a method of producing the n-type Si region 507, the n-type Si region 507 can be also formed at a temperature of approximately 700 to 1000° C. by using a thermal diffusion method using $POCl_3$ as a diffusion source. In order not to degrade junction characteristics with a layer formed before the process, it is preferable that in the process, a hydrogenated amorphous silicon film or a microcrystalline silicon film or a nanocrystalline silicon film is formed at a substrate temperature of not more than approximately 400° C. particularly using the thin film technique described in FIG. 3. If the p-type Si-BSF region 506 is formed using the thin film technique, it must be also formed similarly utilizing the thin film technique in the process.

The antireflection film 502 is then formed. Examples of materials for the antireflection film 502 include an $Si_3N_4$ film, a $TiO_2$ film, an SnO2 film, an MgO film, an ITO film, an $SnO_2$ film, and a ZnO film. The thickness of the antireflection film 502 is suitably selected depending on the material. It is possible to realize non-reflection conditions for incident light by making the thickness of the antireflection film 502 the most suitable (let n be the refractive index of the material and λ be the wavelength of a spectrum which does not be desired to reflect incident light, d satisfying (λ/n)/4=d is the most suitable thickness of the antireflection film). In the case of the $Si_3N_4$ film (n=about 2) generally used, for example, if a non-reflection wavelength is 600 nm, the film thickness may be approximately 75 nm.

As a method of producing the antireflection film 502, the antireflection film 502 is formed at a temperature of approximately 400 to 500° C. using a PECVD method, a vacuum evaporation method, a sputtering method, etc. The antireflection film 502 is previously patterned in a predetermined pattern in order to form the front electrode 501, described later. It is possible to use, as a patterning method, an etching method (wet etching or dry etching) using a resist or the like as a mask and a method of previously forming a mask at the time of forming an antireflection film and removing the mask after forming the antireflection film.

The front electrode 501 is then formed. Preferably used as materials for the front electrode is a material including at least one type of low-resistive metals such as Ag, Cu and Al. Examples of a method of producing the front electrode 501 include a printing method using a paste containing the metal or metals or a vacuum film formation method such as a sputtering method and a vacuum evaporation method.

In order to particularly enhance adhesive strength between the front electrode 501 and the Si semiconductor, an oxide component such as $TiO_2$ may be contained in a small amount in a paste in the printing method, while a metal layer mainly composed of Ti may be inserted into the interface between the front electrode 501 and the Si semiconductor in the vacuum film formation method. The shape of the front electrode 501 may be a general comb-shaped pattern comprising busbar electrode and finger electrode.

The rear electrode 508 is then formed. Preferably used as materials for the rear electrode is a metal mainly composed of Ag having a high index of reflection on Si. Even a metal mainly composed of Al having an index of reflection on Si, which is slightly lower than Ag, can be effectively used unless high efficiency is particularly desired.

Examples of a method of producing the rear electrode 508 include a printing method using a paste containing the metal or metals and a vacuum film formation method such as a sputtering method or a vacuum evaporation method. When it is desired to particularly enhance adhesive strength between the rear electrode 508 and the Si semiconductor, an oxide component such as $TiO_2$ may be contained in a small amount in a paste in the printing method, while a metal layer mainly composed of Ti may be inserted into the interface between the rear electrode 508 and the Si semiconductor in the vacuum film formation method. In the latter case, it is desirable that the thickness of the metal layer mainly composed of Ti is set to not more than 5 mm, to prevent the index of reflection from being reduced by inserting the metal layer. It is desirable that the rear electrode 508 is formed over the whole back surface of the substrate in order to increase the index of reflection of long-wavelength light which has reached the back surface.

As described in the foregoing, a bulk type silicon solar cell to which the present invention is applied is manufactured.

The order of the processes is not limited to the above-mentioned order. For example, the processes may be carried out in any order, provided that conditions under which the temperature in the process in the succeeding stage is lower than the temperature in the process in the preceding stage are satisfied.

Although description was made of the solar cell in which the semiconductor/electrode contact structure according to the present invention is applied to both the sides of the front electrode 501 and the rear electrode 508, it goes without saying that the effect of the present invention is obtained even when it is applied to only the side of the front electrode or the side of the rear electrode.

Although description was made of the solar cell using the p-type Si substrate, the effect of the present invention can be obtained by the same processes if the polarity in the description is reversed even when the n-type Si substrate is used.

Although description was made of the case of a single junction type, the present invention is also applicable to a multi-junction type in which thin film junction layers composed of semiconductor multi-layer films as described in FIG. 3 are stacked on a junction device using a bulk substrate.

Figure 7:
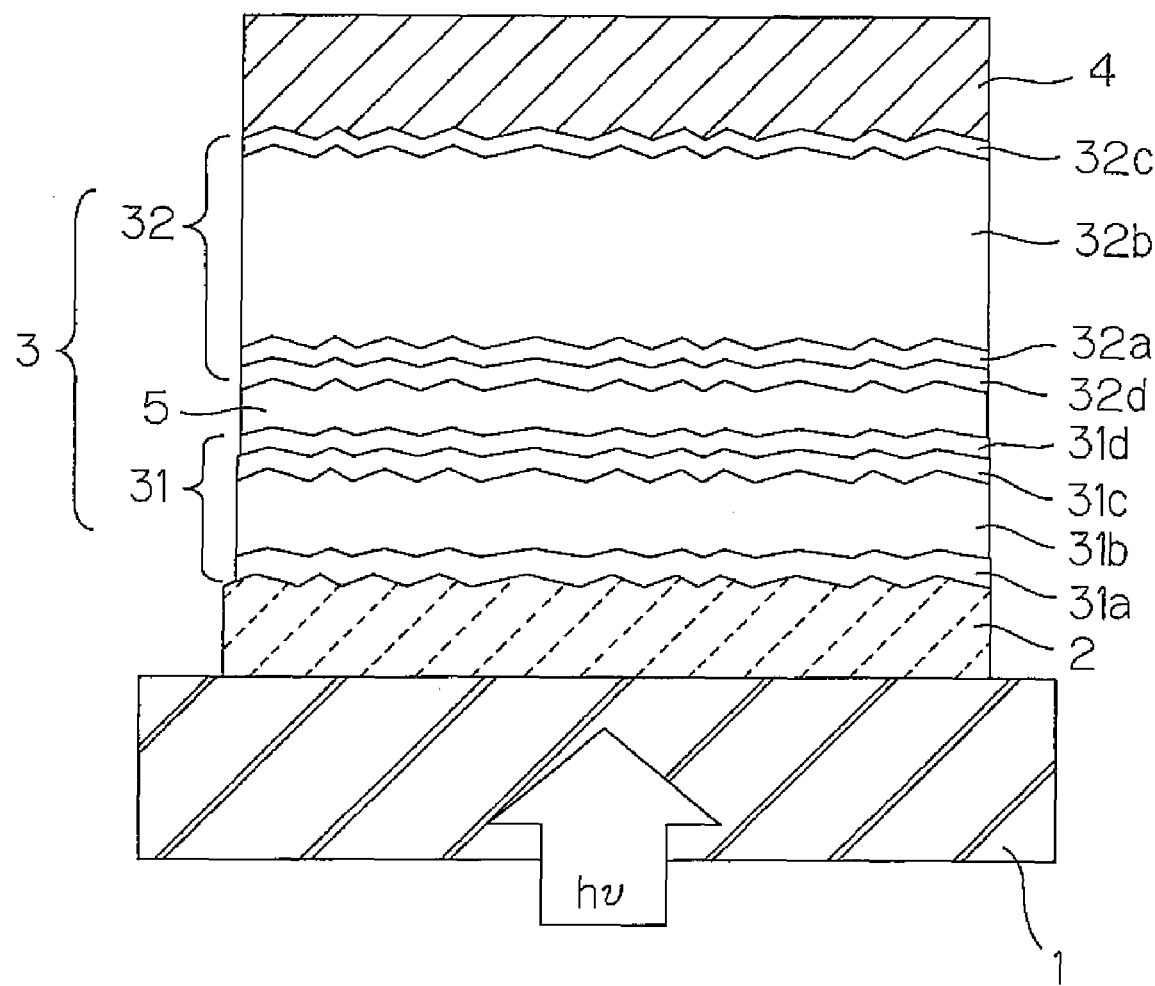
FIG. 7 is a cross-sectional view of a superstrate type thin film silicon solar cell having a transparent intermediate layer 5.
Figure 8:
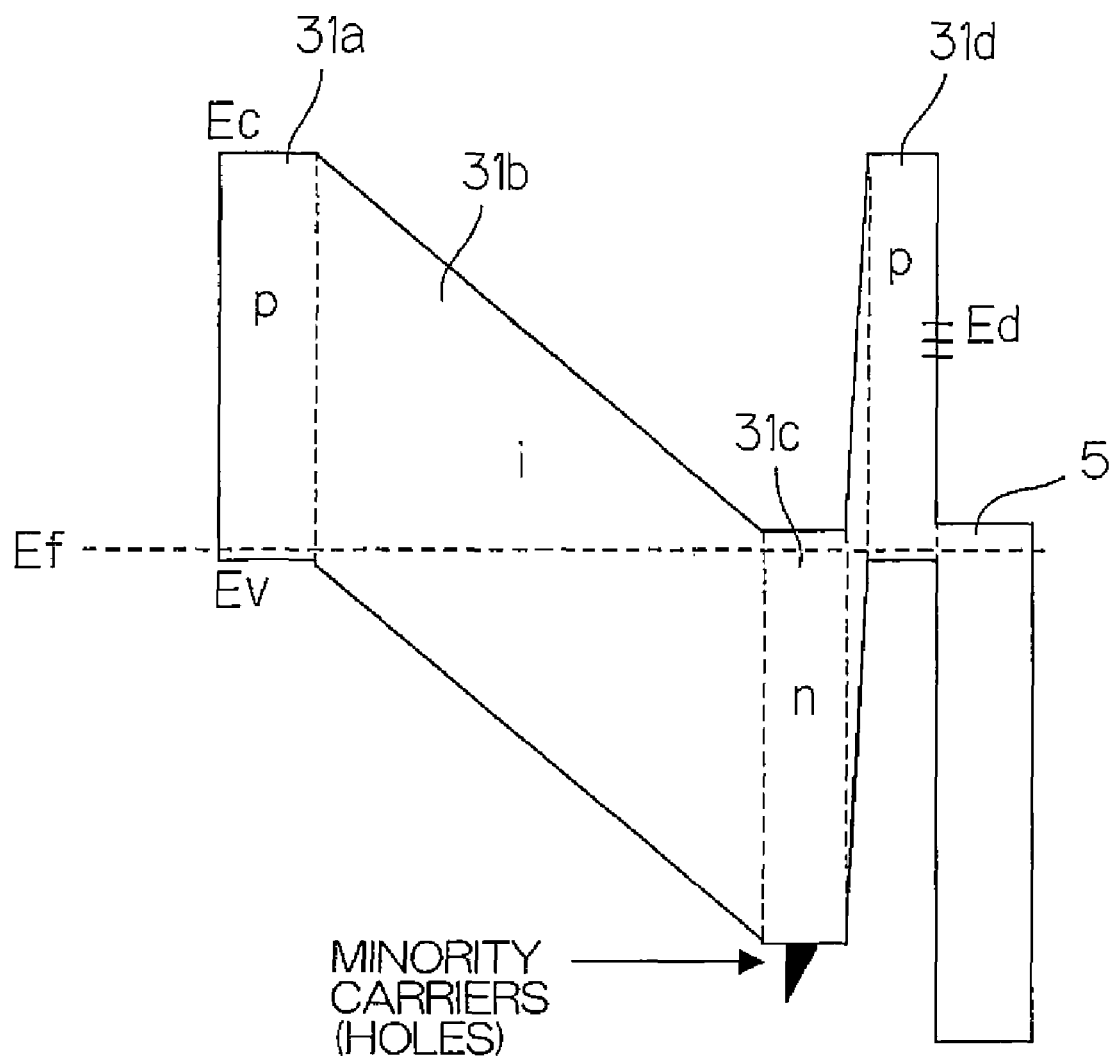
FIG. 8 is a band diagram of a semiconductor device shown in FIG. 7.

Description is now made taking, as the multi-junction type semiconductor device according to the present invention, a super-straight type thin film silicon solar cell in which light is incident on a substrate, as shown in FIG. 7. The thin film silicon solar cell differs from the super-straight type thin film silicon solar cell shown in FIG. 3 is that a transparent intermediate layer is interposed between a first semiconductor junction layer and a second semiconductor junction layer.

As shown in FIG. 7, a front electrode 2 composed of a transparent conductive material, a semiconductor multi-layer film 3, and a rear electrode 4 are formed in this order on a transparent substrate 1. The semiconductor multi-layer film 3 is formed with a transparent intermediate layer 5 having conductive properties interposed between a first semiconductor junction layer 31 and a second semiconductor junction layer 32. The first semiconductor junction layer 31 comprises a pin junction of a p-type layer 31a, a photoactive layer 31b of an i type, and an n-type layer 31c, and the second, semiconductor junction layer 32 comprises a pin junction of a p-type layer 32a, a photoactive layer 32b of an i type, and an n-type layer 32c.

From the viewpoint of high efficiency, a material having a large band gap energy, e.g., an amorphous silicon material represented by hydrogenated amorphous silicon is used for the photoactive layer 31b in the first semiconductor junction layer 31 which is a top cell positioned on the side of a light incidence surface in the semiconductor junction layer. On the other hand, a material having a small band gap energy, e.g., a microcrystalline silicon or a nanocrystalline silicon is used for the photoactive layer 32b in the second semiconductor junction layer 32 which is a bottom cell positioned on the opposite side to the light incidence surface.

In the multi-junction type semiconductor device according to the present invention, a p-type layer 31d of a conductivity type opposite to that of the n-type layer 31c in the first semiconductor junction layer 31 is interposed between the pin junction in the first semiconductor junction layer 31 and the transparent intermediate layer 5. Further, an n-type layer 32d of a conductivity type opposite to that of the p-type layer 32a in the second semiconductor junction layer 32 is interposed between the second semiconductor junction layer 32 and the transparent intermediate layer 5.

Although the p-type layer 31d and the n-type layer 32d which are the semiconductor layers of the opposite conductivity types may be provide on one side of the transparent intermediate layer 5 to produce the effect of the present invention, it is desirable that they are provided on both sides of the transparent intermediate layer 5 because the effect of the present invention can be more reliably produced.

Furthermore, although the n-type layer 31c and the p-type layer 31d of the opposite conductivity type and the p-type layer 32a and the n-type layer 32d of the opposite conductivity type are respectively combined with each other to form pn inverse junctions, thereby producing the effect of the present invention, the concentration of a doping element in each of the layers may be $1\times10^{18} \sim 5\times10^{21}/cm^3$ in regions where they are in contact with each other, i.e., the pn inverse junctions. If the concentration of the doping element is thus made high, the junctions can be a tunnel junction or a junction having characteristics conforming thereto, thereby allowing good ohmic characteristics to be obtained.

If light (hv) is incident on the transparent substrate 1 in the multi-junction type semiconductor device according to the present invention, the light passes through the front electrode 2 and is photoelectrically converted, respectively, in the first semiconductor junction layer 31 and the second semiconductor junction layer 32, to produce photovoltaic power.

As described in the foregoing, the first semiconductor junction layer 31 has high light absorption characteristics for short-wavelength light because the photoactive layer 31b includes an amorphous silicon material having large band gap energy. The second semiconductor junction layer 32 has high light absorption characteristics for long-wavelength light because the photoactive layer 32b includes a microcrystalline silicon or a nanocrystalline silicon having a small band gap energy. Therefore, it is possible to perform photoelectric conversion over a wide wavelength range of incident light.

By adjusting the refractive index and the thickness of the transparent intermediate layer provided between the first semiconductor junction layer 31 and the second semiconductor junction layer 32, the transparent intermediate layer 5 makes it easier to reflect, in light which has reached the transparent intermediate layer 5 after being incident on the light incidence surface to pass through the first semiconductor junction layer 31, a short wavelength component which cannot be absorbed in the photoactive layer 31b in the first semiconductor junction layer 31 and to transmit a long wavelength component which is absorbed in the photoactive layer 32b in the second semiconductor junction layer 32. This allows the light energy density of the short wavelength component to be increased in the semiconductor junction layer 31 positioned on the side of the light incidence surface with respect to the transparent intermediate layer 5, while allowing the light energy density of the long wavelength component to be increased in the semiconductor junction layer 32 positioned on the downstream side in light transmission of the transparent intermediate layer 5.

As described in the foregoing, the semiconductor junction layer/transparent intermediate layer structure according to the present invention is a structure in which a pn inverse junction is introduced between the semiconductor junction layer 31 and the transparent intermediate layer 5 or between the photoelectric conversion unit 32 and the transparent intermediate layer 5, so that electrical characteristics in a portion where the pn inverse junction is introduced is significantly improved. That is, it is presumed that electrical characteristics are improved by the principle and mechanism of the function of the present invention, previously described, thereby making it feasible to improve characteristics and yield.

Description is now made of the processes of manufacturing the device according to the present invention.

First, a transparent substrate is prepared as the substrate 1. A material for the transparent, substrate is the same as that described using FIG. 3 and hence, the description thereof is not repeated.

A front electrode 2 is then formed. The processes are the same as those described using FIG. 3 in that it is desirable to form a transparent conductive film as the front electrode 2 and in a material for the transparent conductive film and a method of producing the same.

A semiconductor multi-layer film 3 composed of a silicon-based film is then formed. The semiconductor multi-layer film 3 has a structure in which a first semiconductor junction layer 31, a transparent intermediate layer 5 composed of a transparent conductive oxide film or the like, and a second semiconductor junction layer 32 are stacked.

Although the semiconductor junction layers 31 and 32 are formed of a silicon-based film, a method of forming the semiconductor junction layers is effective if a Cat-PECVD method is used, in addition to the methods conventionally known, as already described using FIG. 3.

First, the first semiconductor junction layer 31 is formed. The first semiconductor junction layer 31 serves as a top cell on which light is first incident, and has a structure in which a p-type layer 31a, a photoactive layer 31b, an n-type layer 31c, and a p-type layer 31d are stacked in this order from the side of a substrate. The photoactive layer 31b includes a hydrogenated amorphous silicon film. It is desirable that the photoactive layer 31b is of an i type.

The present invention is characterized in that the p-type layer 31d is formed between a pin junction (the p-type layer 31a/the photoactive layer 31b/the n-type layer 31c) included in the first semiconductor junction layer 31 and the transparent intermediate layer 5.

The transparent intermediate layer 5 is then formed.

Furthermore, the second semiconductor junction layer 32 is formed as a bottom cell. The second semiconductor junction layer 32 has a structure in which an n-type layer 32d, a p-type layer 32a, a photoactive layer 32b, and an n-type layer 32c are stacked in this order from the side of the substrate. The photoactive layer 32b includes a microcrystalline silicon film or a nanocrystalline silicon film. It is desirable that the photoactive layer 32b is of an i type.

The present invention is characterized in that the n-type layer 31d is formed between the transparent intermediate layer 5 and a pin junction (the p-type layer 32a/the photoactive layer 32b/the n-type layer 32c) included in the second semiconductor junction layer 32.

Description is now made of the process of producing the first semiconductor junction layer 31.

As to the p-type layer 31a, a hydrogenated amorphous silicon film, a microcrystalline silicon film or a nanocrystalline silicon film, etc. can be used. B, Al, Ga, etc. can be used for impurities to be doped so that the layer 31a can be of a p type. Among them, however, B which allows a hydrogen compound gas to be obtained and has a high doping efficiency is desirable.

The concentration of a doping element is set to approximately $1 \times 10^{18} \sim 5 \times 10^{21}/cm^3$ so that the conductivity type of the p-type layer 31a is substantially changed into a $p^+$ type. The film thickness of the $p^+$-type layer 31a is adjusted in a range of approximately 2 to 100 nm depending on a material. For example, the film thickness is in a range of approximately 2 to 20 nm particularly in consideration of reduction in a light absorption loss when the hydrogenated amorphous silicon material is used, while being in a range of approximately 10 to 100 nm in consideration of reduction in junction formation capability when the microcrystalline silicon or nanocrystalline, silicon is used.

If a gas containing C (carbon) such as $CH_4$ is mixed in a suitable amount in addition to gases such as $SiH_4$, $H_2$, and $B_2H_6$ serving as a doping gas which are used at the time of film formation, an $Si_xC_{1-x}$ film is obtained, which is very effective for window layer formation having a low light absorption loss and is also effective for reduction in a dark current component for improving an open circuit voltage. In this case, if the content of C is set to approximately 5 to 20%, an enlargement amount of a band gap can be approximately 0.1 to 0.3 eV. The content of C in the film can be set to a desired value if plasma power is adjusted in consideration of a partial pressure ratio (i.e., a gas flow ratio) of $CH_4$ to $SiH_4$ during film formation and the difference in decomposition efficiency between $CH_4$ and $SiH_4$. Further, a gas containing O (oxygen) and a gas containing N (nitrogen) may be respectively mixed in suitable amounts, so that an $SiO_{1-x}$ film and an $Si_xN_{1-x}$ film can be obtained, thereby allowing the same effect to be obtained. The gases may be mixed.

The photoactive layer 31b serving as a non-doped layer which is not doped is then formed on the p-type 31a. A hydrogenated amorphous silicon film is used for the photoactive layer 31b. In practice, the non-doped layer usually exhibits somewhat n-type characteristics. In this case, therefore, the photoactive layer 31b can be so adjusted as to be substantially of an type by including a p-type doping element in a small amount. The photoactive layer 31b may, in some cases, be of an n-type or a p-type in order to finely adjust the internal electric field strength distribution.

In order to match currents between the top cell (the first semiconductor junction layer 31) and the bottom cell (the second semiconductor junction layer 32), described later, at the same time incident light is photoelectrically converted efficiently, the film thickness of the photoactive layer 31b is adjusted in a range of approximately 0.1 to 0.5 μm.

The PECVD method and the Cat-CVD method which have been conventionally known can be also used as a method of forming a hydrogenated amorphous silicon film. The use of the Cat-PECVD method is particularly effective for manufacture of a high-efficiency and low-cost thin film silicon solar cell because a high-quality hydrogenated amorphous silicon film can be formed at high speed and in a large area and with high productivity if the Cat-PECVD method is used.

The Cat-PECVD method allows an in-film hydrogen concentration to be not more than 15 atomic % by an effect of promoting the formation of atomic hydrogen or an effect of gas heating. However, a film having a low hydrogen concentration of preferably not more than 10 atomic % which is difficult to realize in the conventional PECVD method or more preferably not more than 5 atomic % is obtained. Therefore, it is possible to significantly reduce the degree of degradation by light which is a longstanding problem of a device utilizing a hydrogenated amorphous silicon film.

The n-type layer 31c is then formed on the photoactive layer 31b. As to the n-type layer 31c, a hydrogenated amorphous silicon film or a microcrystalline silicon film or a nanocrystalline silicon film can be used, and the film thickness thereof is adjusted in a range of approximately 2 to 100 nm depending on a material. For example, the film thickness is in a range of approximately 2 to 20 nm particularly in consideration of reduction in the light absorption loss when the hydrogenated amorphous silicon material is used, while being in a range of approximately 10 to 100 nm in consideration of reduction in junction formation capability when the microcrystalline silicon or nanocrystalline silicon is used.

The concentration of the doping element in the n-type layer 31c is set to approximately $1 \times 10^{18} \sim 5 \times 10^{21}/cm^3$ so that the n-type layer 31c is substantially changed into an $n^+$ type. If a gas containing C (carbon) such as $CH_4$ is mixed in a suitable amount in addition to gases such as $SiH_4$, $H_2$, and $PH_3$ serving as a doping gas which are used at the time of film formation, an $Si_xC_{1-x}$ film is obtained, which allows film formation having a low light absorption loss, and is also effective for reduction in a dark current component for improving an open circuit voltage. Further, the same effect can be obtained even by mixing a gas containing O (oxygen) or a gas containing N (nitrogen) in a suitable amount.

In order to form a tunnel junction or a junction having characteristics conforming thereto between the n-type layer 31c and the p-type layer 31d, described later, it is more preferable to use a microcrystalline silicon film or a nanocrystalline silicon film having a small band gap. Of course, the microcrystalline silicon film or nanocrystalline silicon film need not be used over the whole n-type layer 31c. It may, in some cases, be used in only the vicinity of the interface between the n-type layer 31c and the p-type layer 31d. This allows a light absorption loss in a narrow band gap region to be made as low as possible.

The p-type layer 31d is then formed on the n-type 31c. As to the p-type layer 31d, a hydrogenated amorphous silicon film or a microcrystalline silicon film or a nanocrystalline silicon film can be used. Here, the hydrogenated amorphous silicon exhibits high light absorption characteristics of a direct transition type, while crystalline silicon exhibits relatively low light absorption characteristics of an indirect transition type. In order to reduce the light absorption loss, therefore, it is more preferable to use the microcrystalline silicon film or nanocrystalline silicon film.

Furthermore, the microcrystalline silicon or nanocrystalline silicon has a narrower band gap than the hydrogenated amorphous silicon. In order to form a tunnel junction or a pn inverse junction having characteristics conforming thereto between the p-type layer 31d and the n-type layer 31c, therefore, it is preferable to use the microcrystalline silicon film or nanocrystalline silicon film. Of course, the microcrystalline silicon film or nanocrystalline silicon film need not be used over the whole p-type layer 31d. It may, in some cases, be used in only the vicinity of the interface between the p-type layer 31d and the n-type layer 31c. This allows a light absorption loss in a narrow band gap region to be made as low as possible.

Here, impurities are doped into the p-type layer 31d so that the layer 31d can be of a p type. In a silicon semiconductor, B, Al, Ga, etc. can be used as a doping element in order to obtain a p type. Among them, however, B is desirable from the reasons already described.

The concentration of the doping element is set to not less than $1 \times 10^{18} \sim 5 \times 10^{21}/cm^3$ so that the conductivity type of the p-type layer 31d is substantially changed into a $p^+$ type, thereby making it possible to form a tunnel junction or a junction having characteristics conforming thereto between the p-type layer 31d and the n-type layer 31c previously formed. The concentration of the doping element need not be realized over the whole p-type layer 31d. For example, it may be realized in a region in contact with at least the n-type layer 31c and specifically, in a range of not less than the thickness of at least one atomic layer nor more than the thickness of the p-type layer 31d.

It is preferable that the film thickness of the p-type layer 31d is not more than approximately 20 nm and more preferably not more than 10 nm, to make a light absorption loss and a resistance loss in the layer as low as possible. If the film thickness is more preferably not more than 5 nm, allowing carriers to tunnel through the p-type layer 31d itself, a resistance loss caused by the p-type layer 31d can be reduced to approximately zero, thereby making it possible to obtain a pn inverse junction in which ohmic characteristics are hardly degraded.

Examples of raw materials for forming the p-type layer 31d are gases such as $SiH_4$, $H_2$, and $B_2H_6$ serving as a doping gas. Here, B is acquired in the layer in rough proportion to a partial pressure ratio of $B_2H_6$ to $SiH_4$. By adjusting a partial pressure ratio (specifically, a gas flow ratio) corresponding to a target doping concentration, therefore, a desired doping concentration can be realized. The film thickness may be set by adjusting the film formation time depending on the film formation speed.

In order to further crystallize the p-type layer 31d, in a substrate temperature range of approximately 100 to 400° C. in which a surface of the layer can be coated with hydrogen, the crystallization is easily feasible by setting a plasma excitation frequency to a VHF region of not less than approximately 40 MHz, for example, or positively performing gas heating.

If a gas containing C (carbon) such as $CH_4$ is mixed in a suitable amount in addition to gases such as $SiH_4$, $H_2$, and $B_2H_6$ serving as a doping gas which are used at the time of film formation, an $Si_xC_{1-x}$ film is obtained, so that the light absorption loss is reduced by enlargement of the band gap. This is very effective for formation of a so-called window layer, and is also effective for reduction in a dark current component for improving an open circuit voltage. In this case, if the content of C is set to approximately 5 to 20%, an enlargement amount of the band gap can be approximately 0.1 to 0.3 eV. The content of C in the film can be set to a desired value if plasma power is adjusted in consideration of a partial pressure ratio (i.e., a gas flow ratio) of $CH_4$ to $SiH_4$ during film formation and the difference in decomposition efficiency between $CH_4$ and $SiH_4$. Further, a gas containing O (oxygen) and a gas containing N (nitrogen) may be respectively mixed in suitable amounts, so that an $Si_xO_{1-x}$ film and an $Si_xN_{1-x}$ film can be obtained, thereby allowing the same effect to be obtained. The gases may be mixed.

In order to further improve junction characteristics, an amorphous Si layer which is substantially of an i type or an amorphous $Si_xC_{1-x}$ layer may be inserted as a buffer layer between the p-type layer 31a and the photoactive layer 31b and between the photoactive layer 31b and the n-type layer 31c. The thickness of the layer to be inserted in this case is approximately 0.5 to 50 nm. When the in-film hydrogen concentration and the C concentration are inclined to change the layer to be inserted into a so-called graded layer in this case, a recombination rate in a region where the graded layer is formed can be reduced, which is more preferable in terms of improvement in characteristics.

By the above-mentioned method, the first semiconductor junction layer 31 serving as the top cell can be formed.

As the transparent intermediate layer 5, a film is then formed using a transparent conductive oxide material. Examples of the transparent conductive oxide material are $SnO_2$, ITO, and ZnO. Examples of a method of forming the film are known, techniques such as a CVD method, a vacuum evaporation method, an ion plating method, a sputtering method, a spraying method, and a sol-gel method.

Here, the thickness d of the transparent intermediate layer 5 isoptimized depending on the refractive index ($n_5$) of an oxide material to be used, the refractive indexes ($n_{31}$, $n_{32}$) of semiconductor layers in contact with the transparent intermediate layer 5, the band gap energy of the above-mentioned photoactive layer 31b in the first semiconductor junction layer 31, and the band gap energy of the photoactive layer 32b in the second semiconductor junction layer 32, described later.

When hydrogenated amorphous silicon is used for the photoactive layer 31b in the first semiconductor junction layer 31, and microcrystalline silicon or nanocrystalline silicon is used for the photoactive layer 32b in the second semiconductor junction layer 32, as in the present embodiment, it is desirable that ZnO is used as a material for the transparent intermediate layer 5, and the thickness d thereof is adjusted in a range of 5 to 500 nm in reducing a light absorption loss in the transparent intermediate layer 5.

Although the second semiconductor junction layer 32 is then stacked as a bottom cell on the transparent intermediate layer 5, the description of a portion which can be formed in the same method as the method of forming the first semiconductor junction layer 31 is omitted, to describe a characteristic portion.

The n-type layer 32d of the opposite conductivity type provided between the transparent intermediate layer 5 and the p-type layer 32a in the second semiconductor junction layer 32 can use a hydrogenated amorphous silicon film or a microcrystalline silicon film or a nanocrystalline silicon film, similarly to the above-mentioned p-type layer 31d in the first semiconductor junction layer 31. The p-type layer 32d is approximately the same as the p-type layer 31d in the detailed conditions such as the film thickness and the doping concentration except that P, As, Sb, etc. exhibiting n-type conductivity are used as only a doping element.

The p-type layer 32a is then formed on the n-type 32d of the opposite conductivity type. The p-type layer 32a can use a hydrogenated amorphous silicon film or a microcrystalline silicon film or a nanocrystalline silicon film, similarly to the above-mentioned p-type layer 31a in the first semiconductor junction layer 31. The detailed conditions such as the film thickness and the doping concentration are approximately the same as the foregoing conditions and hence, the description thereof is not repeated.

The photoactive layer 32b serving as a non-doped layer which is not doped is then formed on the p-type 32a. Although the photoactive layer 31b is formed of a hydrogenated amorphous silicon film in the first semiconductor junction layer 31, the photoactive layer 32b in the second semiconductor junction layer 32 is formed of a microcrystalline silicon film or a nanocrystalline silicon film. In practice, the non-doped layer usually exhibits somewhat n-type characteristics. In this case, therefore, the photoactive layer 32b can be so adjusted as to be substantially of an i type by including a p-type doping element in a small amount.

In order to match currents between the top cell and the bottom cell at the same time incident light is photoelectrically converted efficiently, the film thickness of the photoactive layer 32b is adjusted in a range of approximately 1 to 3 μm.

Furthermore, although it is desirable that as the film structure of the photoactive layer 32b, the shape of its surface after film formation has an autonomous textured structure (microroughness) suitable for light confinement as a set of columnar crystal grains in the orientation of a (110) plane in a crystal plane, which occurs as a result of preferential growth of the (110) plane, the use of the PECVD method or the Cat-PECVD method has the advantage that the structure can be naturally formed.

Although the PECVD method and the Cat-CVD method which have been conventionally known can be also used as a method of forming a microcrystalline silicon film or a nanocrystalline silicon film, a particularly high-quality microcrystalline silicon film or nanocrystalline silicon film can be formed at high speed and in a large area and with high productivity if the Cat-PECVD method is used. Consequently, the method is particularly effective for manufacture of a high-efficiency and low-cost thin film silicon solar cell.

Although the Cat-PECVD method allows a microcrystalline silicon film or a nanocrystalline silicon film having an in-film hydrogen concentration of not more than 10 atomic % to be obtained by an effect of promoting the formation of atomic hydrogen or an effect of gas heating, it is possible to obtain a film having a low hydrogen concentration of preferably not more than 5 atomic % or more preferably not more than 3.5 atomic %.

The reason why the film having a low hydrogen concentration is preferable is as follows. In the case of the microcrystalline silicon film or nanocrystalline silicon film, a large part of hydrogen exists in a crystal grain boundary. Since a bonded state of hydrogen and Si and its density (which are proportional to an inverse number of a carrier recombination rate in the crystal grain boundary) determine the quality of the crystal grain boundary. That is, the higher the density of an $SiH_2$ bond in a state where one Si atom which exists in the crystal grain boundary is bonded to two H atoms and other two Si atoms is, the more easily a so-called post-oxidation phenomenon, described above, occurs, thereby bringing about degradation with time in the quality of the whole film (i.e., degradation with time in characteristics) caused by degradation in the quality of the crystal grain boundary. Here, as the in-film hydrogen concentration decreases, the density of the $SiH_2$ bond in the crystal grain boundary decreases, thereby allowing a degradation phenomenon with time caused by the above-mentioned post-oxidation phenomenon to be reduced.

Specifically, a degradation ratio with time can be suppressed to not more than several percents when the in-film hydrogen concentration is not more than 5 atomic %, and can be further reduced to approximately zero when the in-film hydrogen concentration is not more than 3.5 atomic %. As a result, it is possible to manufacture a higher-efficiency solar cell.

The n-type layer 32c is then formed on the photoactive layer 32b. The n-type layer 32c can use a hydrogenated amorphous silicon film or a microcrystalline silicon film or a nanocrystalline silicon film, similarly to the above-mentioned n-type layer 31c in the first semiconductor junction layer 31. The detailed conditions such as the thickness and the doping concentration are the same as the foregoing conditions and hence, the description thereof is not repeated.

In order to further improve junction characteristics, an amorphous silicon layer which is substantially of an i type may be inserted between the p-type layer 32a and the photoactive layer 32b or between the photoactive layer 32b and the n-type layer 32c. The thickness of a layer to be inserted in this case is approximately 0.5 to 50 nm.

Finally, a metal film is formed as the rear electrode 4. Preferably used as the metal film are ones mainly composed of Al, Ag, etc. superior in conductive properties and light reflection properties, as previously described using the drawings. A method of forming the metal film is as previously described using FIG. 3. It is more preferable that the rear electrode 4 has a structure in which the transparent conductive film and the metal film are stacked in this order from the side of its surface in contact with the semi-conductor layer. However, this is as previously described.

By the above-mentioned method, the thin film silicon solar cell to which the present invention is applied can be realized.

Although description was made of an example in which the structure according to the present invention is applied to both sides of the transparent intermediate layer, the effect of the present invention can be obtained even when it is applied to only one side of the transparent intermediate layer.

Although description was made of a tandem type solar cell in which there are two semiconductor junction layers as the multi-junction type semiconductor device, the same effect is obtained even in a single junction type solar cell (not shown) having one semiconductor junction layer, a triple junction type solar cell (not shown) having three semiconductor junction layers, and a solar cell (not shown) having more semiconductor junction layers.

Although description was made of the solar cell in which the semiconductor junction layers pin are formed, in this order from the side of a light receiving surface, the same effect is obtained with respect to a solar cell in which the semiconductor junction layers pin are formed in the opposite order from the side of a light receiving surface.

Although description was made of the super-straight type solar cell in which light is incident on the substrate, the same effect is obtained with respect to a substrate type solar cell in which light is incident on the semiconductor film. In the case of the substrate type solar cell, a substrate is not limited to a transparent substrate. For example, an opaque substrate composed of stainless or the like may be used. In this case, the front electrode 2 is composed of a metal material, and the rear electrode 4 is composed of a transparent material.

Although description was made by taking as an example the silicon-based semiconductor, a semiconductor other than the silicon-based semiconductor may be used, in which case the same effect can be obtained by applying the configuration of the present invention because they are the same in the nature in principle.

Figure 9:
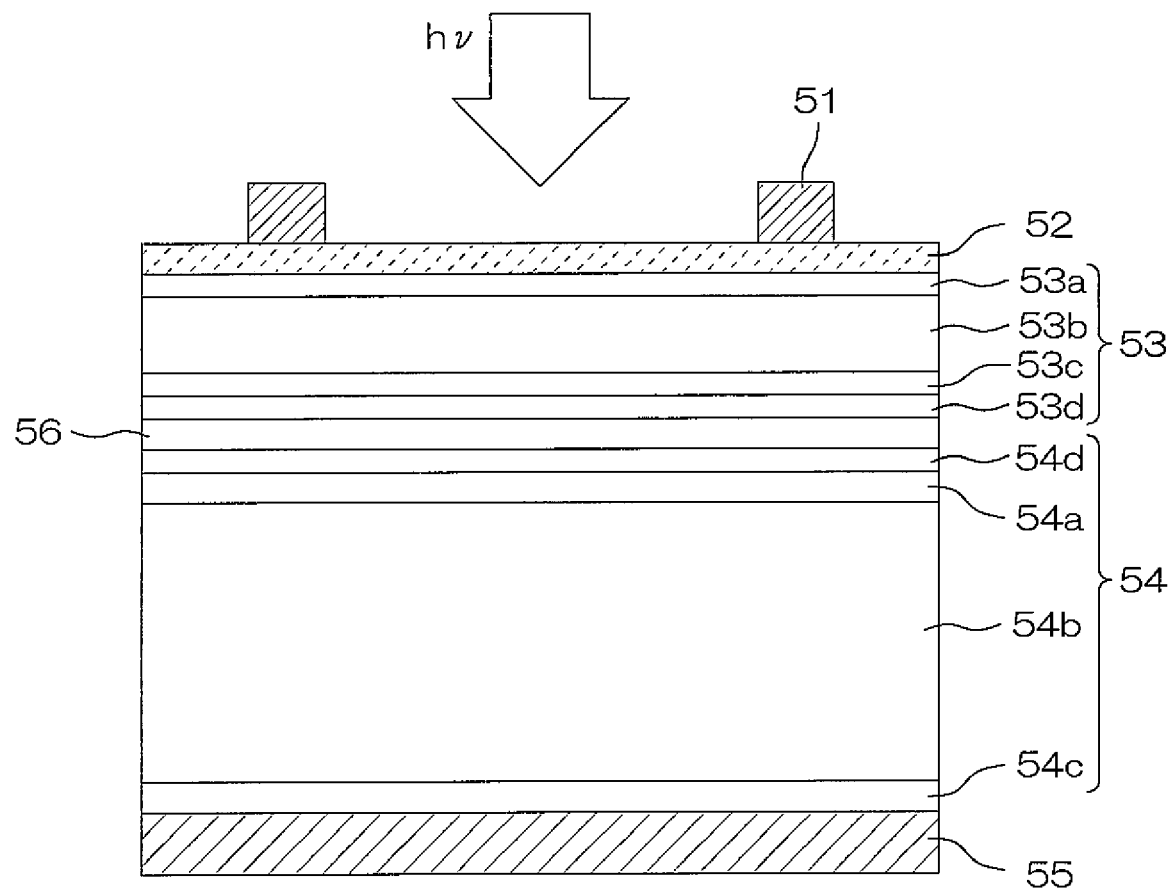
FIG. 9 is a cross-sectional view of a multi-junction type silicon solar cell obtained by stacking thin film Si cells and bulk type Si cells.
Figure 10:
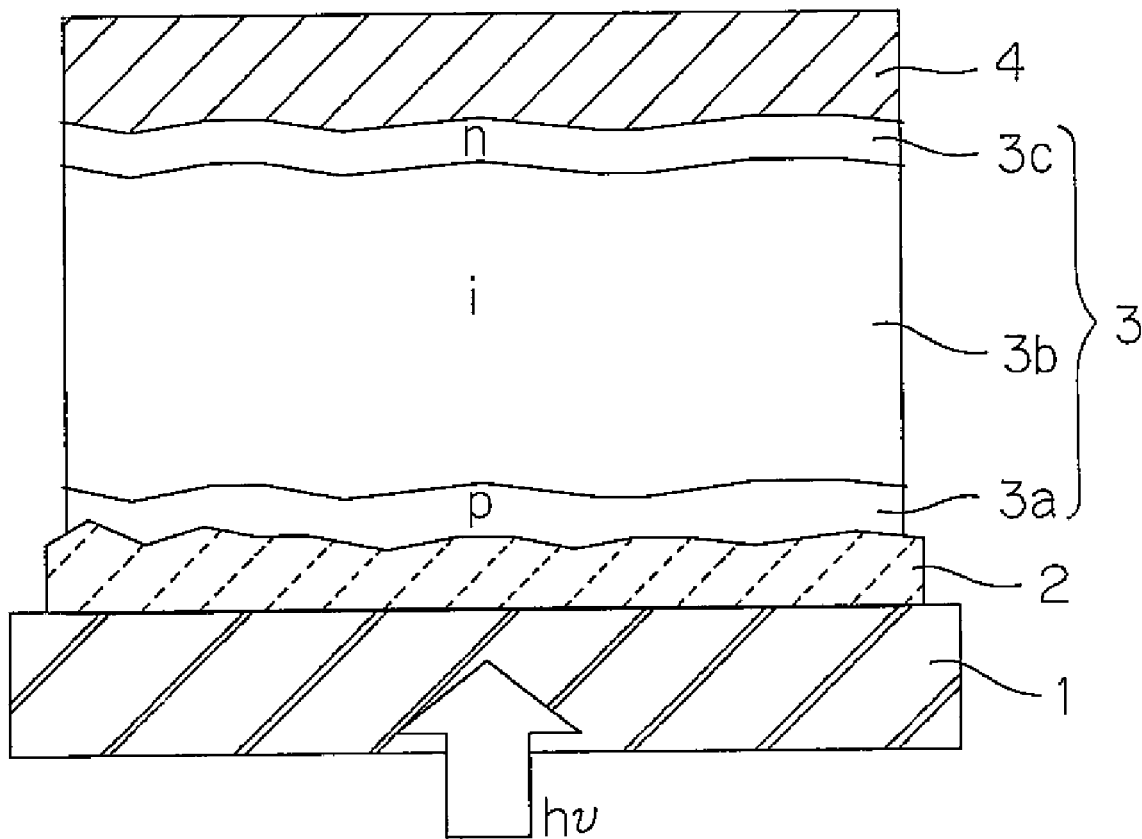
FIG. 10 is a diagram showing the configuration of a thin film solar cell which is a conventional multi-junction type semiconductor device.
Figure 11:
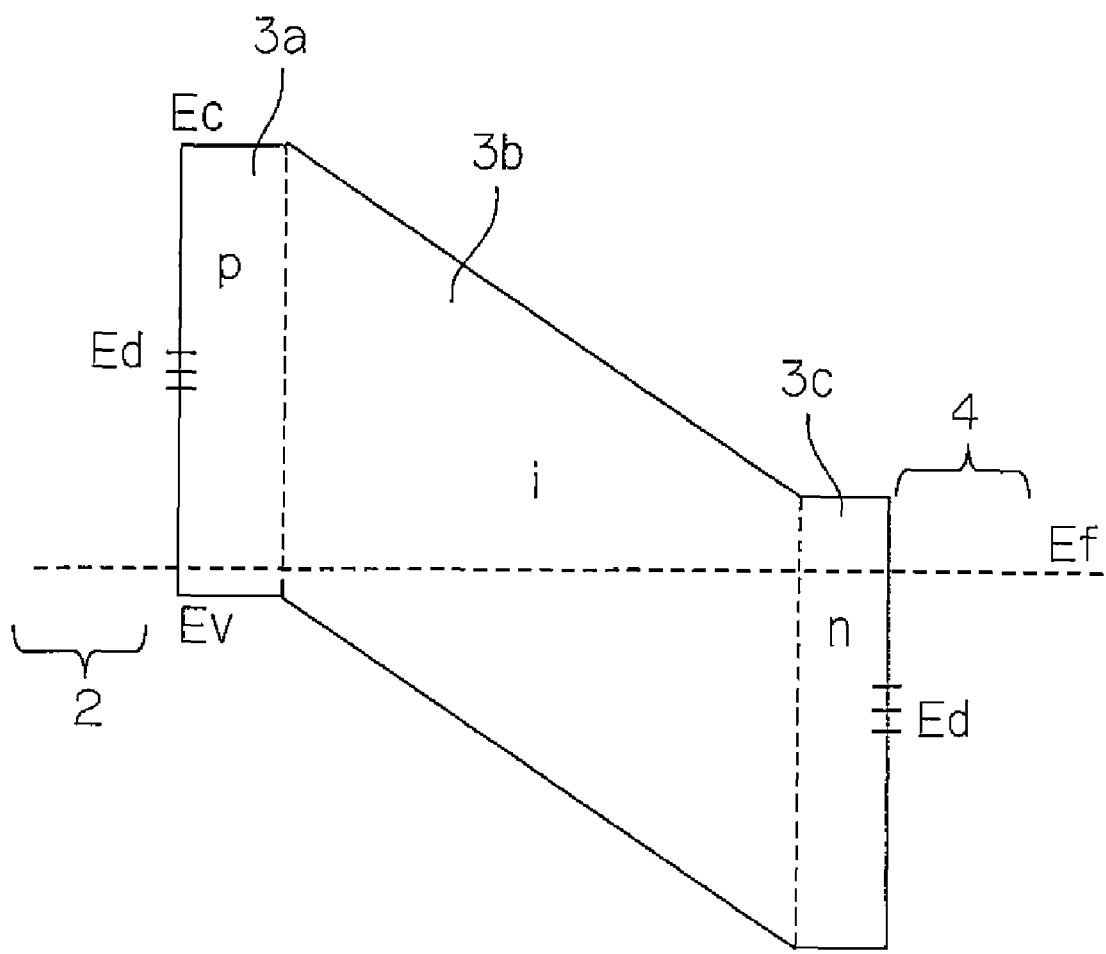
FIG. 11 is a band diagram of the thin film solar cell shown in FIG. 10.
Figure 12:
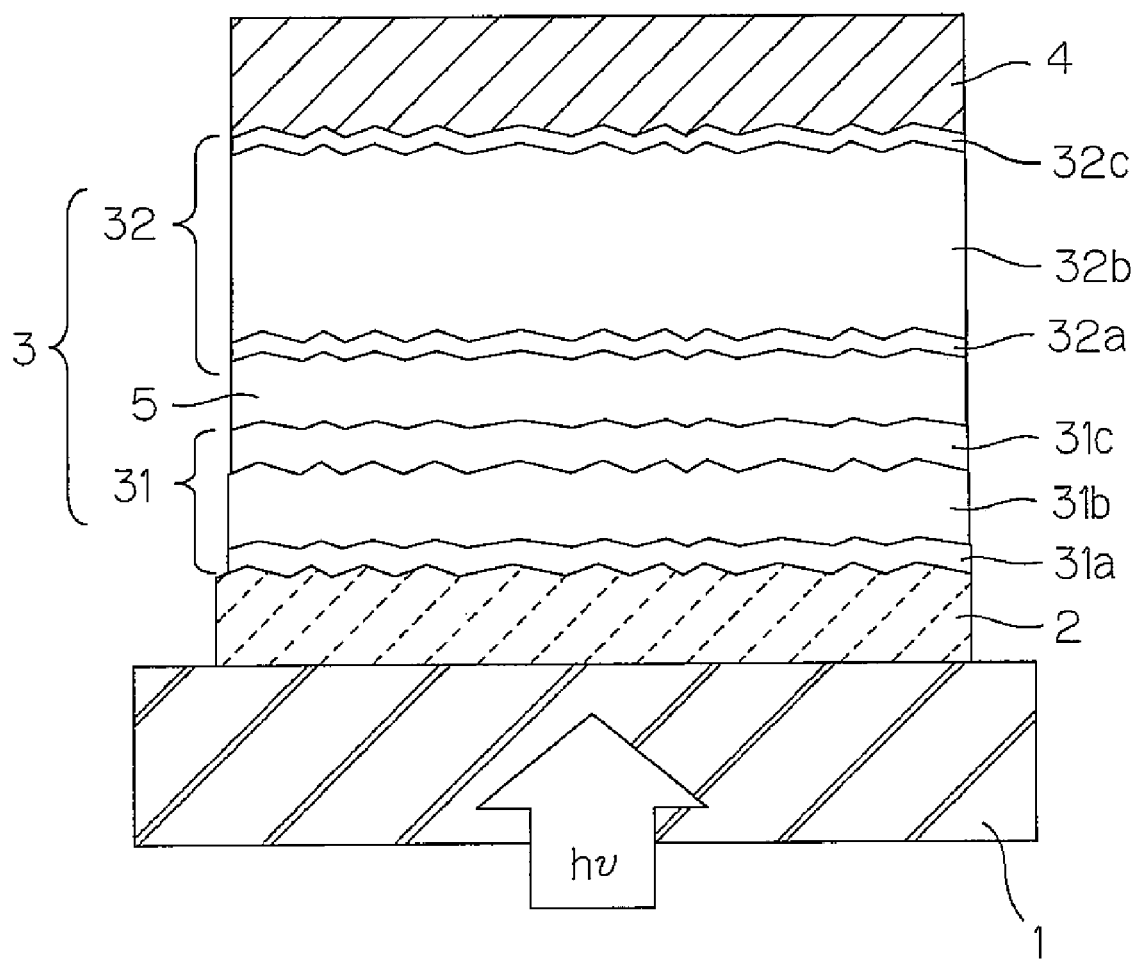
FIG. 12 is a diagram showing the configuration of a conventional thin film solar cell obtained by introducing two semiconductor junction layers and a transparent intermediate layer 5.
Figure 13:
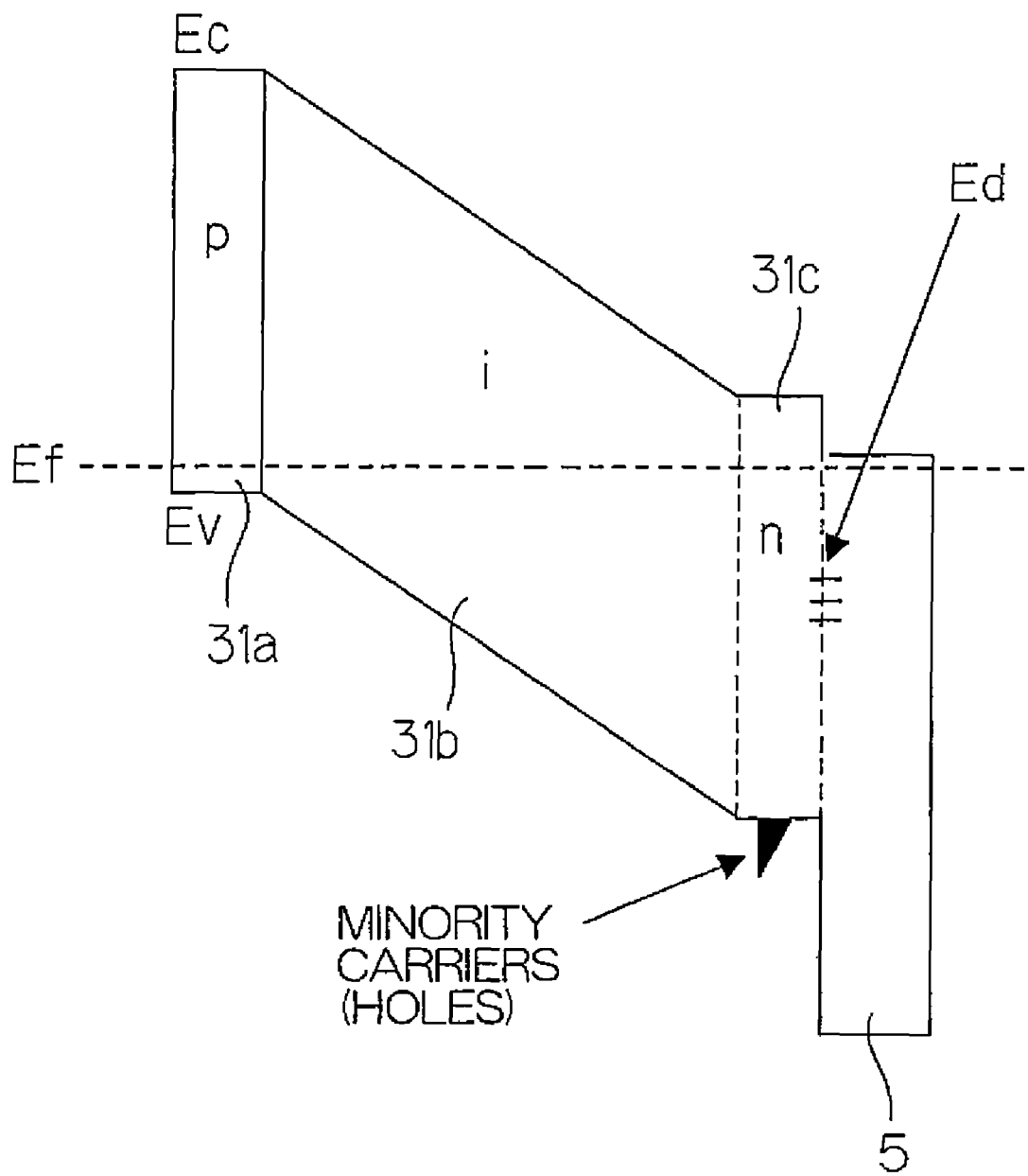
FIG. 13 is a band diagram of the thin film solar cell shown in FIG. 12.

FIG. 9 illustrates a solar cell serving as a multi-junction type semiconductor device obtained by stacking thin film Si cells and bulk type Si cells.

In the solar cell serving as the multi-junction type semiconductor device, a first semiconductor junction layer 53 composed of the thin film cells and a second semiconductor junction layer 54 composed of the bulk type Si cells are stacked with the transparent intermediate layer 56 interposed therebetween.

An antireflection film 52 and a front electrode 51 are provided on the first semiconductor junction layer 53, and a rear electrode 55 is provided on the second semiconductor junction layer 54.

Furthermore, the first semiconductor junction layer 53 is obtained by stacking an n-type layer 53a, a photoactive layer 53b, and a p-type layer 53c, and the second semiconductor junction layer 54 is obtained by stacking an $n^+$-type region 54a, a p-type photoactive region 54b, and a $p^+$-type region 54c.

As a structure representing the features of the present invention, the n-type layer 53d is interposed between the first semiconductor junction layer 53 and the transparent intermediate layer 56, and the n-type layer 53d and the p-type layer 53c in the first semiconductor junction layer 53 form a pn inverse junction. Further, a $p^+$-type region 54d is interposed between the second semiconductor junction layer 54 and the transparent intermediate layer 56, and the $P^+$-type layer 54d and the $n^+$-type region 54a in the second semiconductor junction layer 54 form a pn inverse junction.

Here, light (hv) is incident on the antireflection film 52. The same principle as that described in the first embodiment allows the light energy density of a short wavelength component to be increased in the semiconductor junction layer 53 positioned on the incidence side (on the top side), while allowing the light energy density of a long wavelength component to be increased in the semiconductor junction layer 54 positioned on the downstream side in light transmission of the transparent intermediate layer 56.

As described in the foregoing, the structure shown in FIG. 9 is a structure in which pn inverse junctions are respectively introduced between the semiconductor junction layer 54 and the transparent intermediate layer 56 and between the photoelectric conversion unit 53 and the transparent intermediate layer 56, so that electrical characteristics are significantly improved by the principle and mechanism of the function of the present invention, previously described, thereby making it feasible to improve characteristics and yield.

Description is now made of the processes of manufacturing a thin film cell/bulk cell stacking type solar cell device serving as a multi-junction type semiconductor device obtained by stacking thin film Si cells and bulk type Si cells shown in FIG. 9.

First, a p-type Si substrate is prepared. In FIG. 9, at least the p-type photoactive region 54b is included in the substrate. B (Boron) or Ga (Gallium) is preferably used as a p-type doping element in the substrate; and the concentration thereof is approximately $1\times10^{16}\sim1\times10^{17}/cm^3$ (the specific resistance value of the substrate is approximately 0.2 to 2Ω·cm in this case).

The thickness of the substrate is preferably not more than 500 μm, and more preferably not more than 350 μm. A material for the substrate and a method of producing the substrate are as already described using FIG. 6 and hence, the description thereof is not repeated.

The $n^+$-type region 54a is then formed. P (phosphorus) is preferably used as an n-type doping element, and the doping concentration I thereof is approximately $1\times10^{18}\sim5\times10^{21}/cm^3$ so that the region 54a can be of an $n^+$ type. Consequently, a pn junction is formed between the $n^+$-type region 54a and the above-mentioned p-type photoactive region 54b. A method of producing the $n^+$-type region 54a is the same as the method of producing the n-type Si region 504 shown in FIG. 6.

The $p^+$-type region 54c is then formed. B (Boron), Ga (Gallium), or Al (Aluminum) can be used as a p-type doping element, and the doping concentration thereof is approximately $1\times10^{18}\sim5\times10^{21}/cm^3$. This allows a Low-High junction (also referred to as a back surface field region) to be formed between the p-type photoactive region 54b and the $p^+$-type region 54c.

A method of producing the $p^+$-type region 54c is the same as the method of producing the BSF region 506 shown in FIG. 6 and hence, the description thereof is not repeated again.

The $p^+$-type region 54d is then formed. B or Ga is preferably used as a p-type doping element, and the doping concentration thereof is approximately $1\times10^{18}\sim5\times10^{21}/cm^3$. The $p^+$-type region 54 is thus doped at a high concentration, thereby forming a junction having tunnel junction characteristics or characteristics conforming thereto, which is a constituent element in the present invention, between the $p^+$-type region 54d and the $n^+$-type region 54a which is similarly doped at a high concentration. In this case, the doping concentration need not be realized over the whole $p^+$-type region 54d. It may be realized in a region in contact with at least the above-mentioned $n^+$-type region 54a and specifically, in a range of not less than the thickness of at least one atomic layer or not more than the thickness of the $p^+$-type region 54d.

Here, the thickness of the $P^+$-type region 54d may be not more than approximately 50 nm and more preferably not more than 20 nm, to make a light absorption loss and a resistance loss in the layer as low as possible. If the thickness is more preferably not more than 5 nm, to allow carriers to tunnel through the $p^+$-type region 54d itself, a resistance loss caused by the $p^+$-type region 54d can be reduced to approximately zero, thereby making it possible to obtain a semiconductor/electrode contact at which ohmic characteristics are hardly degraded.

As a method of producing the $p^+$-type region 54d, the $p^+$-type region 54d can be also formed at a temperature of approximately 800 to 1000° C. by using a thermal diffusion method using $BBr_3$ as a diffusion source. In order not to degrade junction characteristics formed before the process, however, it is preferable that in the process, a hydrogenated amorphous silicon film or a microcrystalline silicon film or a nanocrystalline silicon film is formed at a substrate temperature of not more than approximately 400° C. using the thin film technique and the conditions as described particularly with reference to FIG. 3. When the $n^+$-type region 54a is formed using the thin film technique, it must be formed similarly utilizing the thin film technique in the process.

The transparent intermediate layer 56 is then formed. The process of forming the transparent intermediate layer 56 is the same as that described in the transparent intermediate layer shown in FIG. 7 and hence, the description thereof is not repeated.

The second semiconductor junction layer 53 having hydrogenated amorphous silicon as a photoactive layer 53b is then stacked. The process of forming the junction unit is basically the same as the contents described in the first semiconductor junction layer 31 shown in FIG. 7, and films may be stacked in the order shown in FIG. 9 and hence, the description thereof is not repeated.

The antireflection film 52 is then formed. A material for the antireflection film 52, the thickness thereof, and a method of producing the same are the same as the contents described in the antireflection film 502 shown in FIG. 6 and hence, the description thereof is not repeated again.

The front electrode 51 is then formed. A material for the front electrode 51 and a method of producing the same are the same as the contents described in the front electrode 501 shown in FIG. 6 and hence, the description thereof is not repeated again.

The rear electrode 55 is then formed. A material for the rear electrode 55 and a method of producing the same are the same as the contents described in the rear electrode 508 shown in FIG. 6 and hence, the description thereof is not repeated again.

As described in the foregoing, the solar cell obtained by stacking the thin film Si cells and the bulk type Si cells, to which the present invention is applied, is realized.

The order of the processes is not limited to the above-mentioned order. For example, the processes may be carried out in any order, provided that conditions under which the temperature in the process in the succeeding stage is lower than the temperature in the process in the preceding stage are satisfied.

Although description was made of an example in which the configuration of the present invention is applied to both sides of the transparent intermediate layer, it goes without saying that the effect of the present invention can be obtained even when it is applied to only one side of the transparent intermediate layer.

Although description was made of the solar cell using the p-type Si substrate, the effect of the present invention can be obtained by the same processes if the polarity in the description is reversed even when the n-type Si substrate is used.

Although description was made of the case of a single junction type, the present invention is also applicable to a multi-junction type in which thin film junction layers composed of semiconductor multi-layer films as described in FIG. 3 are stacked on a junction device using a bulk substrate.

Although description was made using as an example the thin film-type silicon solar cell and the bulk-type silicon solar cell using several drawings, the present invention is not limited to the same. For example, it takes an arbitrary form unless it departs from the scope of the present invention. The present invention is not limited to the Si-based solar cell. For example, it is also applicable to compound-based and organic-based solar batteries. Further, the present invention is also applicable to a photoelectric conversion device other than the solar cell. The present invention is also applicable to semiconductor devices in general having a semiconductor/electrode structure, for example, a diode, a transistor, and a thyristor, other than the photoelectric conversion device.

EXAMPLES

Examples of the present invention will be described.

Example 1

The thin film silicon solar cell device was manufactured on the basis of the configuration shown in FIG. 3 in the present invention. Manufacturing conditions are shown in Table 1.

TABLE 1

| | | First electrode 2 Constituent material | n-type semiconductor layer 31d | | | | | p-type semiconductor layer 31a |
|---|---|---|---|---|---|---|---|---|
| | Sample No. | | Doping element concentration (cm$^{-3}$) | Thickness (nm) | Element for enlarging band gap | Band cap width (ev) | Si crystal phase is included | Doping element concentration (cm$^{-3}$) |
| * | 1 | SnO$_2$ | — | — | — | — | — | 1E19~7E20 |
|   | 2 | SnO$_2$ | 3E19~1E21 | 2 | — | 1.1~1.3 | ○ | 1E19~7E20 |
|   | 3 | SnO$_2$ | — | — | — | — | — | 1E19~7E20 |
|   | 4 | SnO$_2$ | 3E19~1E21 | 2 | — | 1.1~1.3 | ○ | 1E19~7E20 |
| * | 5 | SnO$_2$ | 5E+17 | 2 | — | 1.1~1.3 | ○ | 1E19~7E20 |
|   | 6 | SnO$_2$ | 2E+18 | 2 | — | 1.1~1.3 | ○ | 1E19~7E20 |
|   | 7 | SnO$_2$ | 3E+21 | 2 | — | 1.1~1.3 | ○ | 1E19~7E20 |
| * | 8 | SnO$_2$ | 6E+21 | 2 | — | 1.1~1.3 | ○ | 1E19~7E20 |
|   | 9 | SnO$_2$ | 3E19~1E21 | 4 | — | 1.1~1.3 | ○ | 1E19~7E20 |
|   | 10 | SnO$_2$ | 3E19~1E21 | 7 | — | 1.1~1.3 | ○ | 1E19~7E20 |
|   | 11 | SnO$_2$ | 3E19~1E21 | 18 | — | 1.1~1.3 | ○ | 1E19~7E20 |
|   | 12 | SnO$_2$ | 3E19~1E21 | 25 | — | 1.1~1.3 | ○ | 1E19~7E20 |
| * | 13 | SnO$_2$ | 3E19~1E21 | 2 | — | 1.1~1.3 | ○ | 1E19~7E20 |
|   | 14 | SnO$_2$ | 3E19~1E21 | 2 | — | 1.1~1.3 | ○ | 1E19~7E20 |
|   | 15 | SnO$_2$ | 3E19~1E21 | 2 | — | 1.1~1.3 | ○ | 1E19~7E20 |
| * | 16 | SnO$_2$ | 3E19~1E21 | 2 | — | 1.1~1.3 | ○ | 1E19~7E20 |
|   | 17 | SnO$_2$ | 3E19~1E21 | 2 | — | 1.1~1.3 | ○ | 1E19~7E20 |
|   | 18 | SnO$_2$ | 3E19~1E21 | 2 | — | 1.1~1.3 | ○ | 1E19~7E20 |
|   | 19 | SnO$_2$ | 3E19~1E21 | 2 | — | 1.1~1.3 | ○ | 1E19~7E20 |
|   | 20 | SnO$_2$ | 3E19~1E21 | 2 | — | 1.1~1.3 | ○ | 1E19~7E20 |
|   | 21 | SnO$_2$ | 3E19~1E21 | 2 | C | 1.3~1.5 | ○ | 1E19~7E20 |
|   | 22 | SnO$_2$ | 3E19~1E21 | 2 | — | 1.1~1.3 | ○ | 1E19~7E20 |
|   | 23 | SnO$_2$ | 3E19~1E21 | 2 | — | 1.6~1.8 | X | 1E19~7E20 |
|   | 24 | SnO$_2$ | 3E19~1E21 | 2 | — | 1.1~1.3 | ○ | 1E19~7E20 |

| | | n-type semiconductor layer 32c | p-type semiconductor layer 32d | | | | | Second |
|---|---|---|---|---|---|---|---|---|
| | Sample No. | Doping element concentration (cm$^{-3}$) | Doping element concentration (cm$^{-3}$) | Thickness (nm) | Element for enlarging band gap | Band gap width (eV) | Si cyrstal phase is included | electrode 4 Constituent material |
| * | 1 | 3E19~1E21 | — | — | — | — | — | ZnO/Ag |
|   | 2 | 3E19~1E21 | — | — | — | — | — | ZnO/Ag |
|   | 3 | 3E19~1E21 | 1E19~7E20 | 5 | — | 1.1~1.3 | ○ | ZnO/Ag |
|   | 4 | 3E19~1E21 | 1E19~7E20 | 5 | — | 1.1~1.3 | ○ | ZnO/Ag |
| * | 5 | 3E19~1E21 | 1E19~7E20 | 5 | — | 1.1~1.3 | ○ | ZnO/Ag |
|   | 6 | 3E19~1E21 | 1E19~7E20 | 5 | — | 1.1~1.3 | ○ | ZnO/Ag |
|   | 7 | 3E19~1E21 | 1E19~7E20 | 5 | — | 1.1~1.3 | ○ | ZnO/Ag |

TABLE 1-continued

|   | No. | Col3 | Col4 | Col5 | Col6 | Col7 | Col8 | Col9 |
|---|---|---|---|---|---|---|---|---|
| * | 8  | 3E19~1E21 | 1E19~7E20 | 5  | — | 1.1~1.3 | ○ | ZnO/Ag |
|   | 9  | 3E19~1E21 | 1E19~7E20 | 5  | — | 1.1~1.3 | ○ | ZnO/Ag |
|   | 10 | 3E19~1E21 | 1E19~7E20 | 5  | — | 1.1~1.3 | ○ | ZnO/Ag |
|   | 11 | 3E19~1E21 | 1E19~7E20 | 5  | — | 1.1~1.3 | ○ | ZnO/Ag |
|   | 12 | 3E19~1E21 | 1E19~7E20 | 5  | — | 1.1~1.3 | ○ | ZnO/Ag |
| * | 13 | 3E19~1E21 | 5E+17     | 5  | — | 1.1~1.3 | ○ | ZnO/Ag |
|   | 14 | 3E19~1E21 | 2E+18     | 5  | — | 1.1~1.3 | ○ | ZnO/Ag |
|   | 15 | 3E19~1E21 | 3E+21     | 5  | — | 1.1~1.3 | ○ | ZnO/Ag |
| * | 16 | 3E19~1E21 | 6E+21     | 5  | — | 1.1~1.3 | ○ | ZnO/Ag |
|   | 17 | 3E19~1E21 | 1E19~7E20 | 4  | — | 1.1~1.3 | ○ | ZnO/Ag |
|   | 18 | 3E19~1E21 | 1E19~7E20 | 7  | — | 1.1~1.3 | ○ | ZnO/Ag |
|   | 19 | 3E19~1E21 | 1E19~7E20 | 18 | — | 1.1~1.3 | ○ | ZnO/Ag |
|   | 20 | 3E19~1E21 | 1E19~7E20 | 25 | — | 1.1~1.3 | ○ | ZnO/Ag |
|   | 21 | 3E19~1E21 | 1E19~7E20 | 5  | — | 1.1~1.3 | ○ | ZnO/Ag |
|   | 22 | 3E19~1E21 | 1E19~7E20 | 5  | C | 1.3~1.5 | ○ | ZnO/Ag |
|   | 23 | 3E19~1E21 | 1E19~7E20 | 5  | — | 1.1~1.3 | ○ | ZnO/Ag |
|   | 24 | 3E19~1E21 | 1E19~7E20 | 5  | — | 1.6~1.8 | X | ZnO/Ag |

\* is an example outside the scope of the present invention.

The first electrode 2 serving as a front electrode was composed of $SnO_2$, and the second electrode 4 serving as a rear electrode had a stacked structure of ZnO and Ag (ZnO on the side of the second semiconductor junction layer 32). The n-type semiconductor layer 31d and the p-type semiconductor layer 32d relating to the semiconductor/electrode contact structure according to the present invention were film-formed while changing conditions by the Cat-PECVD method. The changed-conditions are the doping element concentration, the thickness, the addition of an element for enlarging a band gap (the adjustment of a band gap value), and the presence or absence of inclusion of an Si crystal phase and specifically, are as mentioned in Table 1.

The p-type semiconductor layer 31a and the n-type semiconductor layer 32a were respectively film-formed by the Cat-PECVD method. Each of the semiconductor layers was film-formed while adjusting the amount of a dopant so that the doping element concentration would be not less than $1 \times 10^{18}$ $cm^{-3}$, as shown in Table 1.

Although omitted in Table 1, in the first semiconductor junction layer 31 serving as a top cell, an i-type hydrogenated amorphous silicon film was formed to a thickness of 0.3 μm by the Cat-PECVD method for the photoactive layer 31b, and a hydrogenated amorphous silicon film having P added thereto as a dopant at a concentration of $3 \times 10^{19} \sim 1 \times 10^{21}$ $cm^3$ was formed to a thickness of 10 nm by the Cat-PECVD method for the n-type semiconductor layer 31c stacked thereon.

Furthermore, in the second semiconductor junction layer 32 serving as a bottom cell, a microcrystalline silicon film or a nanocrystalline silicon film having B added thereto as a dopant at a concentration of $1 \times 10^{19} \sim 7 \times 10^{20}$ $cm^{-3}$ was formed to a thickness of 10 nm by the Cat-PECVD method for the p-type semiconductor layer 32c, and an i-type microcrystalline silicon film was formed to a thickness of 2 μm by the Cat-PECVD method for the photoactive layer 32b stacked thereon.

In Table 1, a sample No. 1 has the conventional contact structure in which no semiconductor layer of the opposite conductivity type is provided in a semiconductor/electrode interface. Although other samples have a configuration in which a semiconductor layer of the opposite conductivity type is provided in the semiconductor/electrode interface according to the configuration of the present invention, the semiconductor layer is film-formed such that the doping element concentration is outside the scope of the present invention with respect to the samples Nos. 5, 8, 13, and 16.

The sample prepared by previously changing an addition amount of a dopant gas was measured by SIMS (secondary-ion mass spectroscopy) such that the doping element concentration mentioned in Table 1 was obtained, to determine film formation conditions. In the SIMS, out of doping elements, B uses $O^{2+}$ as a primary ion source, and P uses $Cs^+$ as a primary ion source. Further, in estimating the doping element concentration, several different points in an analysis region were measured to average them.

As to the thickness, the film thickness of a film previously formed on a dummy substrate under each of the film formation conditions was measured by a step measuring unit using a stylus method, to be a target thickness using a film formation speed calculated therefrom.

As to the band gap value of a thin film, a so-called taut plot method for forming the thin film on a glass substrate and calculating the band gap value thereof using a light absorption coefficient α calculated from data representing its spectral transmittance was employed (if a relational expression of $\alpha h\nu \propto (h\nu - Eg)^2$ is used to plot a square root of αhν against hν, Eg is found; in a case where the right side of the foregoing expression is raised to the third power, a third root of αhν is plotted against hν, to find Eg). Values shown in Table 1 are values found by plotting a square root.

Furthermore, as to the presence or absence of inclusion of an Si crystal phase, it was judged by a Raman spectroscopic evaluation method that an Si crystal phase is included when the ratio of crystallinity thereof is not less than 60% (indicated by ○), and that an Si crystal phase is not included when the ratio of crystallinity thereof is less than 60% (indicated by x). The ratio of crystallinity was defined by crystal phase peak strength/(crystal phase peak strength+amorphous phase peak strength) in a Raman scattering spectrum, where the crystal phase peak strength was defined as a peak strength in $500 \sim 510$ $cm^{-1}$+ a peak strength in 520 $cm^{-1}$, while the amorphous phase peak strength was defined as a peak strength in 480 $cm^{-1}$. Ramanscope System 1000 manufactured by Renishaw using an He—Ne laser (having a wavelength of 632.8 nm) as excitation light was employed to measure a Raman spectrum.

The characteristics and the results of the evaluation of the thin film solar cell device which is each of the samples shown in Table 1 are mentioned in Table 2.

TABLE 2

| | Sample No. | Conversion Efficiency [%] | Jsc [mA/cm$^2$] | Voc [V] | FF | Yield [%] | Comprehensive evaluation |
|---|---|---|---|---|---|---|---|
| * | 1 | 11.0 | 12.9 | 1.30 | 0.656 | 70~90 | — |
|   | 2 | 11.2 | 12.8 | 1.31 | 0.668 | 80~90 | Δ |
|   | 3 | 11.6 | 13.0 | 1.32 | 0.676 | 85~95 | ○ |
|   | 4 | 12.1 | 13.1 | 1.32 | 0.700 | 95~100 | ⊚ |
| * | 5 | 11.6 | 13.0 | 1.32 | 0.676 | 85~95 | Δ |
|   | 6 | 12.0 | 13.1 | 1.32 | 0.694 | 95~100 | ⊚ |
|   | 7 | 11.9 | 12.8 | 1.32 | 0.704 | 95~100 | ⊚ |
| * | 8 | 11.6 | 12.5 | 1.31 | 0.708 | 85~95 | Δ |
|   | 9 | 12.0 | 13.1 | 1.32 | 0.694 | 95~100 | ⊚ |
|   | 10 | 11.7 | 13.0 | 1.32 | 0.682 | 90~100 | ⊚ |
|   | 11 | 11.5 | 12.6 | 1.32 | 0.691 | 85~95 | ○ |
|   | 12 | 11.1 | 12.2 | 1.32 | 0.689 | 85~95 | ○ |
| * | 13 | 11.3 | 12.9 | 1.31 | 0.669 | 80~90 | Δ |
|   | 14 | 12.0 | 13.1 | 1.32 | 0.694 | 90~100 | ○ |
|   | 15 | 12.0 | 13.1 | 1.32 | 0.694 | 90~100 | ○ |
| * | 16 | 11.4 | 12.8 | 1.31 | 0.680 | 80~90 | Δ |
|   | 17 | 12.1 | 13.1 | 1.32 | 0.700 | 95~100 | ⊚ |
|   | 18 | 11.9 | 13.1 | 1.32 | 0.688 | 95~100 | ⊚ |
|   | 19 | 11.8 | 13.0 | 1.32 | 0.688 | 90~100 | ○ |
|   | 20 | 11.5 | 12.8 | 1.32 | 0.681 | 85~95 | ○ |
|   | 21 | 12.6 | 13.6 | 1.33 | 0.697 | 98~100 | ⊚ |
|   | 22 | 12.3 | 13.2 | 1.33 | 0.701 | 95~100 | ⊚ |
|   | 23 | 11.5 | 12.8 | 1.32 | 0.681 | 85~95 | ○ |
|   | 24 | 11.4 | 13.1 | 1.32 | 0.659 | 85~95 | ○ |

* is an example outside the scope of the present invention.

Here, in finding average characteristics and yield in Table 2, 48 devices were produced on a substrate 10 cm square, to evaluate the average characteristics and the yield. As to the comprehensive evaluation, judgment was made by three types of evaluations, i.e., Δ in which there, is an effect, which is not so significant, ○ in which a good effect is obtained, and ⊚ in which a significant effect is obtained using the conventional configuration of the sample No. 1 as the basis.

From Table 2, the evaluation is not more than Δ with respect to the samples Nos. 1, 5, 8, 13, and 16 outside the scope of the present invention, while being not less than Δ so that substantially good results are obtained with respect to the other samples. Therefore, it could be confirmed that the configuration of the present invention had a great effect on improvement in device characteristics and improvement in yield.

Example 2

The bulk type solar cell device shown in FIG. 6 according to the present invention was manufactured in the following manner. Manufacturing conditions are shown in Table 3.

TABLE 3

| | | Front electrode 501 | p-type Si region 503 | | | n-type Si region 504 |
|---|---|---|---|---|---|---|
| | Sample No. | Main constituent material | Doping element concentration (cm$^{-3}$) | Thickness (nm) | Si crystal phase is Included | Doping element concentration (cm$^{-3}$) |
| * | 1 | Ag | — | — | ○ | 2E19~2E21 |
|   | 2 | Ag | 1E+19 | 5 | ○ | 2E19~2E21 |
|   | 3 | Ag | — | — | ○ | 2E19~2E21 |
|   | 4 | Ag | 1E+19 | 5 | ○ | 2E19~2E21 |

| | | p-type Si-BSF region 506 | n-type Si region 507 | | | Rear electrode 508 |
|---|---|---|---|---|---|---|
| | Sample No. | Doping element concentration (cm$^{-3}$) | Doping element concentration (cm$^{-3}$) | Thickness (nm) | Si crystal phase is Included | Main constituent material |
| * | 1 | 2E18~1E19 | — | — | ○ | Ag |
|   | 2 | 2E18~1E19 | — | — | ○ | Ag |
|   | 3 | 2E18~1E19 | 3E+19 | 10 | ○ | Ag |
|   | 4 | 2E18~1E19 | 3E+19 | 10 | ○ | Ag |

* is an example outside the scope of the present invention.

A p-type Si substrate having a thickness of 300 μm (a dopant B concentration is $2\times10^{16}$ cm$^{-3}$) was taken as the p-type Si photoactive region 505, and the n-type Si region 504 was formed thereon so that the doping element concentration of P would be not less than $1\times10^{18}$ cm$^{-3}$ by the thermal diffusion method. Further, Al was doped into the Si-BSF region 506 by the paste printing and firing method, to obtain the p-type Si-BSF region 506.

Thereafter, the p-type Si region 503 and the n-type Si region 507 relating to the semiconductor/electrode contact structure according to the present invention were respectively film-formed on the regions while changing conditions by the Cat-PECVD method. The changed conditions are the doping element concentration, the thickness, and the presence or absence of inclusion of an Si crystal phase and specifically, are as mentioned in Table 3. The p-type Si region 503 was film-formed in conformity with the size of the front electrode 501, described later, using a mask.

Furthermore; an antireflection film composed of silicon nitride was formed to a thickness of approximately 75 nm on the regions by the PECVD method, and both the front electrode 501 and the rear electrode 508 were formed by sputtering Ag. The front electrode 501 was film-formed as a comb-shaped pattern, and the rear electrode 508 was film-formed over its whole surface.

In Table 3, a sample No. 1 has the conventional contact structure in which no semiconductor region of the opposite conductivity type is provided in a semiconductor/electrode interface. Although other samples have a configuration in which a semiconductor region of the opposite conductivity type is provided in the semiconductor/electrode interface according to the configuration of the present invention, a semiconductor region of the opposite conductivity type is provided only on the side of the front electrode 501 with respect to the sample No. 2, a semiconductor region of the opposite conductivity type is provided only on the side of the rear electrode 508 with respect to the sample No. 3, and semiconductor regions of the opposite conductivity types are respectively provided on both the front electrode 501 and the rear electrode 508 with respect to the sample No. 4.

A method of measuring and a method of judging the doping element concentration, the thickness, and the presence or absence of inclusion of an Si crystal phase are entirely the same as those shown in the example 1.

The characteristics and the results of the evaluation of the bulk solar cell device which is each of the samples shown in Table 3 are mentioned in Table 4.

TABLE 4

| | Sample No. | Device characteristics/Results | | | | | |
|---|---|---|---|---|---|---|---|
| | | Conversion efficiency [%] | Jsc [mA/cm$^2$] | Voc [V] | FF | Yield [%] | Comprehensive evaluation |
| * | 1 | 14.9 | 33.0 | 0.600 | 0.753 | 80~90 | — |
| | 2 | 15.3 | 33.4 | 0.612 | 0.749 | 85~95 | ○ |
| | 3 | 15.2 | 33.1 | 0.611 | 0.752 | 85~95 | ○ |
| | 4 | 15.4 | 33.4 | 0.614 | 0.751 | 95~100 | ◉ |

* is an example outside the scope of the present invention.

As to the comprehensive evaluation, judgment was made by two types of evaluations, i.e., ○ in which a good effect is obtained, and ◉ in which a significant effect is obtained using the conventional configuration of the sample No. 1 as the basis.

From Table 4, only yield of not more than 90% is obtained with respect to the sample No. 1 having the conventional configuration, while good effects are obtained with respect to the samples No. 2 to 4 in the present invention. Particularly, with respect to the sample No. 4 in which both the front electrode 501 and the rear electrode 508 are provided with the semiconductor/electrode contact structure according to the present invention, a very good effect is obtained. It could be confirmed that the configuration of the present invention had a great effect on improvement in device characteristics and improvement in yield.

Example 3

The thin film silicon solar cell device having the configuration shown in FIG. 7 according to the present invention was manufactured. Manufacturing conditions are shown in Table 5.

TABLE 5

| Sample No. | n-type layer 31c Doping element concentration ($cm^{-3}$) | p-type layer 31d Doping element concentration ($cm^{-3}$) | Thickness (nm) | Element for enlarging band gap | Band gap width (eV) | Si crystal phase is included | Transparent intermediate layer 5 Constituent material |
|---|---|---|---|---|---|---|---|
| * 1 | 3E19~1E21 | — | — | — | — | — | ZnO |
| 2 | 3E19~1E21 | 3E19~1E21 | 2 | — | 1.1~1.3 | ○ | ZnO |
| 3 | 3E19~1E21 | — | — | — | — | — | ZnO |
| 4 | 3E19~1E21 | 3E19~1E21 | 2 | — | 1.1~1.3 | ○ | ZnO |
| 5 | 3E19~1E21 | 5E17 | 2 | — | 1.1~1.3 | ○ | ZnO |
| 6 | 3E19~1E21 | 2E18 | 2 | — | 1.1~1.3 | ○ | ZnO |
| 7 | 3E19~1E21 | 3E21 | 2 | — | 1.1~1.3 | ○ | ZnO |
| 8 | 3E19~1E21 | 6E21 | 2 | — | 1.1~1.3 | ○ | ZnO |
| 9 | 3E19~1E21 | 3E19~1E21 | 4 | — | 1.1~1.3 | ○ | ZnO |
| 10 | 3E19~1E21 | 3E19~1E21 | 7 | — | 1.1~1.3 | ○ | ZnO |
| 11 | 3E19~1E21 | 3E19~1E21 | 18 | — | 1.1~1.3 | ○ | ZnO |
| 12 | 3E19~1E21 | 3E19~1E21 | 25 | — | 1.1~1.3 | ○ | ZnO |
| 13 | 3E19~1E21 | 3E19~1E21 | 2 | — | 1.1~1.3 | ○ | ZnO |
| 14 | 3E19~1E21 | 3E19~1E21 | 2 | — | 1.1~1.3 | ○ | ZnO |
| 15 | 3E19~1E21 | 3E19~1E21 | 2 | — | 1.1~1.3 | ○ | ZnO |
| 16 | 3E19~1E21 | 3E19~1E21 | 2 | — | 1.1~1.3 | ○ | ZnO |
| 17 | 3E19~1E21 | 3E19~1E21 | 2 | — | 1.1~1.3 | ○ | ZnO |
| 18 | 3E19~1E21 | 3E19~1E21 | 2 | — | 1.1~1.3 | ○ | ZnO |
| 19 | 3E19~1E21 | 3E19~1E21 | 2 | — | 1.1~1.3 | ○ | ZnO |
| 20 | 3E19~1E21 | 3E19~1E21 | 2 | — | 1.1~1.3 | ○ | ZnO |
| 21 | 3E19~1E21 | 3E19~1E21 | 2 | C | 1.3~1.5 | ○ | ZnO |
| 22 | 3E19~1E21 | 3E19~1E21 | 2 | — | 1.1~1.3 | ○ | ZnO |
| 23 | 3E19~1E21 | 3E19~1E21 | 2 | — | 1.6~1.8 | X | ZnO |
| 24 | 3E19~1E21 | 3E19~1E21 | 2 | — | 1.1~1.3 | ○ | ZnO |

| Sample No. | n-type layer 32d Doping element concentration ($cm^{-3}$) | Thickness (nm) | Element for enlarging band gap | Band cap width (eV) | Si crystal phase is included | p-type layer 32a Doping element concentration ($cm^{-3}$) |
|---|---|---|---|---|---|---|
| * 1 | — | — | — | — | 0 | 1E19~7E20 |
| 2 | — | — | — | — | — | 1E19~7E20 |
| 3 | 1E19~7E20 | 5 | — | 1.1~1.3 | ○ | 1E19~7E20 |
| 4 | 1E19~7E20 | 5 | — | 1.1~1.3 | ○ | 1E19~7E20 |
| 5 | 1E19~7E20 | 5 | — | 1.1~1.3 | ○ | 1E19~7E20 |
| 6 | 1E19~7E20 | 5 | — | 1.1~1.3 | ○ | 1E19~7E20 |
| 7 | 1E19~7E20 | 5 | — | 1.1~1.3 | ○ | 1E19~7E20 |
| 8 | 1E19~7E20 | 5 | — | 1.1~1.3 | ○ | 1E19~7E20 |
| 9 | 1E19~7E20 | 5 | — | 1.1~1.3 | ○ | 1E19~7E20 |
| 10 | 1E19~7E20 | 5 | — | 1.1~1.3 | ○ | 1E19~7E20 |
| 11 | 1E19~7E20 | 5 | — | 1.1~1.3 | ○ | 1E19~7E20 |
| 12 | 1E19~7E20 | 5 | — | 1.1~1.3 | ○ | 1E19~7E20 |
| 13 | 5E17 | 5 | — | 1.1~1.3 | ○ | 1E19~7E20 |
| 14 | 2E18 | 5 | — | 1.1~1.3 | ○ | 1E19~7E20 |
| 15 | 3E21 | 5 | — | 1.1~1.3 | ○ | 1E19~7E20 |
| 16 | 6E21 | 5 | — | 1.1~1.3 | ○ | 1E19~7E20 |
| 17 | 1E19~7E20 | 4 | — | 1.1~1.3 | ○ | 1E19~7E20 |
| 18 | 1E19~7E20 | 7 | — | 1.1~1.3 | ○ | 1E19~7E20 |
| 19 | 1E19~7E20 | 18 | — | 1.1~1.3 | ○ | 1E19~7E20 |
| 20 | 1E19-7E20 | 25 | — | 1.1~1.3 | ○ | 1E19~7E20 |
| 21 | 1E19~7E20 | 5 | — | 1.1~1.3 | ○ | 1E19~7E20 |
| 22 | 1E19~7E20 | 5 | C | 1.3~1.5 | ○ | 1E19~7E20 |
| 23 | 1E19~7E20 | 5 | — | 1.1~1.3 | ○ | 1E19~7E20 |
| 24 | 1E19~7E20 | 5 | — | 1.6~1.8 | X | 1E19~7E20 |

* is an example outside the scope of the present invention.

The front electrode 2 uses $SnO_2$, the rear electrode 4 uses a stacked structure of ZnO and Ag (ZnO on the side of the second semiconductor junction layer 32), and the transparent intermediate layer 5 uses ZnO which is a transparent conductive material.

The p-type layer 31d and the n-type layer 32d which are semiconductor layers of opposite conductivity types provided between the transparent intermediate layer 5 and the semiconductor junction layers 31 and 32 relating to the multi-junction type semiconductor device according to the present invention were film-formed while changing conditions by the Cat-PECVD method. The changed conditions are the doping element concentration, the thickness, the addition of an element for enlarging a band gap (adjustment of a band gap value), and the presence or absence of inclusion of an Si crystal phase and specifically, are as mentioned in Table 5.

The n-type layer 31c and the p-type layer 32a which together with the p-type layer 31d and the n-type layer 32d of opposite conductivity types, respectively form pn inverse junctions are film-formed by the Cat-PECVD method. Each of the semiconductor layers was film-formed while adjusting the amount of a dopant so that the doping element concentration would be not less than $1 \times 10^{18}$ $cm^{-3}$, as shown in Table 5

Although omitted in Table, in the first semiconductor junction layer 31 serving as a top cell, a hydrogenated amorphous silicon film having B added thereto as a dopant at a concentration of $1 \times 10^{19} \sim 7 \times 10^{20}/cm^{-3}$ was formed to a thickness of 10 nm by the Cat-PECVD method for the p-type layer 31a, and an i-type amorphous silicon film was formed to a thickness of 0.3 μm by the Cat-PECVD method for the photoactive layer 31b.

Furthermore, in the second semiconductor junction layer 32 serving as a bottom cell, an i-type microcrystalline silicon film was formed to a thickness of 2 μm by the Cat-PECVD method for the photoactive layer 32b, and a microcrystalline silicon film or a nanocrystalline silicon film having P added thereto as a dopant at a concentration of $3 \times 10^{19} \sim 1 \times 10^{21}$ cm$^{-3}$ was formed to a thickness of 10 nm by the Cat-PECVD method for the n-type layer 32c.

Furthermore, for the transparent intermediate layer 5, ZnO was formed to a thickness of approximately 80 to 100 nm by the sputtering method. The refractive index of ZnO formed under the same conditions as the transparent intermediate layer 5 was approximately 2 when it was previously evaluated by ellipsometry.

In Table 5, a sample No. 1 has the conventional configuration in which there is provided, between a semiconductor junction layer and a transparent intermediate layer, no semiconductor layer of the opposite conductivity type. Other samples have the configuration of the multi-junction type semiconductor device according to the present invention.

The sample prepared by previously changing an addition amount of a dopant gas was measured by SIMS (secondary-ion mass spectroscopy) such that the doping element concentration mentioned in Table 5 was obtained, to determine film formation conditions. In the SIMS, out of doping elements, B uses $O^{2+}$ as a primary ion source, and P uses $Cs^+$ as a primary ion source. Further, in estimating the concentration of the element, several different points in an analysis region were measured to average them.

As to the thickness, the film thickness of a film previously formed on a dummy substrate under each of the film formation conditions was measured by a step measuring unit using a stylus method, to be a target thickness using a film formation speed calculated therefrom.

As to the band gap value of a thin film, a so-called taut plot method for forming the thin film on a glass substrate and calculating the band gap value thereof using a light absorption coefficient α calculated from data representing its spectral transmittance was employed (if a relational expression of $\alpha h\nu \propto (h\nu - Eg)^2$ is used to plot a square root of αhν against hν, Eg is found; in a case where the right side of the foregoing expression is raised to the third power, a third root of αhν is plotted against hν, to find Eg) Values shown in Table 5 are values found by plotting a square root.

Furthermore, as to the presence or absence of inclusion of an Si crystal phase, it was judged by a Raman spectroscopic evaluation method that an Si crystal phase is included when the ratio of crystallinity thereof is not less than 60% (indicated by ○), and that an Si crystal phase is not included when the ratio of crystallinity thereof is less than 60% (indicated by x). The ratio of crystallinity was defined by crystal phase peak strength/(crystal phase peak strength+amorphous phase peak strength) in a Raman scattering spectrum, where the crystal phase peak strength was defined as a peak strength in 500~510 cm$^{-1}$+peak strength in 520 cm$^{-1}$, while the amorphous phase peak strength was defined as a peak strength in 480 cm$^{-1}$. Ramanscope System 1000 manufactured by Renishaw using He—Ne laser (having a wavelength of 632.8 nm) as excitation light was employed to measure a Raman spectrum.

The average characteristics (a conversion efficiency, a short-circuit current density Jsc, an open circuit voltage Voc, and a fill factor FF), the yield, and the comprehensive evaluation of the thin film solar cell device which is each of the samples shown in Table 5 are mentioned in Table 6.

TABLE 6

| | Sample No. | Device characteristics/Results | | | | | |
|---|---|---|---|---|---|---|---|
| | | Conversion efficiency [%] | Jsc [mA/cm$^2$] | Voc [V] | FF | Yield [%] | Comprehensive evaluation |
| * | 1 | 11.10 | 13.10 | 1.290 | 0.657 | 70~90 | — |
| | 2 | 11.65 | 12.95 | 1.310 | 0.687 | 85~95 | ○ |
| | 3 | 11.34 | 12.94 | 1.303 | 0.673 | 85~95 | ○ |
| | 4 | 11.82 | 12.92 | 1.314 | 0.696 | 95~100 | ⊚ |
| | 5 | 11.16 | 13.02 | 1.298 | 0.660 | 80~90 | Δ |
| | 6 | 11.59 | 12.96 | 1.310 | 0.683 | 85~95 | ○ |
| | 7 | 11.66 | 12.94 | 1.311 | 0.687 | 85~95 | ○ |
| | 8 | 11.22 | 12.89 | 1.305 | 0.667 | 80~90 | Δ |
| | 9 | 11.64 | 12.91 | 1.311 | 0.688 | 85~95 | ○ |
| | 10 | 11.62 | 12.87 | 1.312 | 0.688 | 85~95 | ○ |
| | 11 | 11.53 | 12.73 | 1.312 | 0.690 | 85~95 | ○ |
| | 12 | 11.26 | 12.43 | 1.313 | 0.690 | 80~90 | Δ |
| | 13 | 11.17 | 12.96 | 1.295 | 0.666 | 80~90 | Δ |
| | 14 | 11.29 | 12.94 | 1.301 | 0.671 | 80~90 | Δ |
| | 15 | 11.33 | 12.93 | 1.304 | 0.672 | 85~95 | ○ |
| | 16 | 11.28 | 12.90 | 1.304 | 0.671 | 80~90 | Δ |
| | 17 | 11.35 | 12.96 | 1.303 | 0.672 | 85~95 | ○ |
| | 18 | 11.32 | 12.91 | 1.303 | 0.673 | 85~95 | ○ |
| | 19 | 11.28 | 12.85 | 1.304 | 0.673 | 80~90 | Δ |
| | 20 | 11.12 | 12.67 | 1.305 | 0.673 | 80~90 | Δ |
| | 21 | 12.09 | 13.02 | 1.324 | 0.701 | 95~100 | ⊚ |
| | 22 | 11.93 | 12.97 | 1.318 | 0.698 | 95~100 | ⊚ |
| | 23 | 11.72 | 12.93 | 1.315 | 0.689 | 95~100 | ⊚ |
| | 24 | 11.75 | 12.98 | 1.316 | 0.688 | 95~100 | ⊚ |

* is an example outside the scope of the present invention.

Here, in finding average characteristics and yield in Table 6, 48 devices were produced on a substrate 10 cm square, to evaluate the average characteristics and the yield. As to the comprehensive evaluation, judgment was made by three types of evaluations, i.e., Δ in which there is an effect, which is not so significant, ⊚ in which a good effect is obtained, and ◉ in which a significant effect is obtained using the conventional configuration of the sample No. 1 as the basis.

From Table 6, with respect to all the samples Nos. 2 to 24 having the configuration of the present invention, the average characteristics (a conversion efficiency, a short-circuit current density Jsc, an open circuit voltage Voc, and a fill factor FF) and the yield have effects above those in the sample No. 1 having the conventional configuration outside the scope of the present invention, so that substantially good results are obtained. Therefore, it could be confirmed that the thin film Si solar cell device having the configuration of the multi-junction type semiconductor device according to the present invention had a great effect in improvement in device characteristics and improvement in yield

Example 4

The thin film cell/bulk cell stacking type solar cell device having the configuration of the multi-junction type semiconductor device according to the present invention was manufactured in the following manner on the basis of the configuration shown in FIG. 9 in the present invention. Conditions are shown in Table 7.

The second semiconductor junction layer 54 composed of a bulk semiconductor multi-layer film was produced in the following manner. A p-type Si substrate having a thickness of 300 μm (a dopant B concentration is $2 \times 10^{16}$ cm$^{-3}$) was taken as the p-type photoactive region 5.4b, and the n$^+$-type region 54a was formed thereon so that the doping element concentration of P would be not less than $1 \times 10^{18}$ cm$^{-3}$ and the diffusion depth thereof would be approximately 0.1 to 0.2 μm by the thermal diffusion method. Further, Al was doped into the region 54c by the paste printing and firing method, to obtain the p$^+$-type region 54c. The p$^+$-type region 54d, provided between the n$^+$-type region 54a and the transparent intermediate layer 56, relating to the configuration of the multi-junction type semiconductor device according to the present invention was formed using B as a dopant by the thin film formation method also described in the example 3. The dopant concentration and the thickness of each of the regions were prepared so as to satisfy the conditions shown in Table 7.

For the transparent intermediate layer 56, ZnO was formed to a thickness of approximately 80 to 100 nm by the sputtering method, similarly to the transparent intermediate layer 5 in the example 3. The refractive index of ZnO formed under the same conditions as the transparent intermediate layer 5 was approximately 2 when it was previously evaluated by ellipsometry.

The first semiconductor junction layer 53 composed of a thin semiconductor multi-layer film was produced in entirely the same manner as the second semiconductor junction layer 32 shown in the example 3. The p-type layer 53c and the n-type layer 53d relating to the configuration of the multi-junction type semiconductor device according to the present invention were respectively film-formed while changing the conditions by the Cat-PECVD method. The changed conditions are the doping element concentration, the thickness, and the presence or absence of inclusion of an Si crystal phase and specifically, are as mentioned in Table 7.

Furthermore, an antireflection film composed of ITO or ZnO was formed to a thickness of approximately 65 to 90 nm on the regions by the sputtering method, and both the front electrode 51 and the rear electrode 55 were formed by sputtering Ag. The front electrode 51 was film-formed as a comb-shaped pattern, and the rear electrode 55 was film-formed over its whole surface.

TABLE 7

| | p-type layer 53c | n-type layer 53d | | | Transparent intermediate layer 56 |
| --- | --- | --- | --- | --- | --- |
| Sample No. | Doping element concentraton (cm$^{-3}$) | Doping element concentration (cm$^{-3}$) | Thickness (nm) | Si crystal phase is included | Constituent material |
| * 1 | 1E19~7E20 | — | — | ○ | ZnO |
| 2 | 1E19~7E20 | 3E19 | 5 | ○ | ZnO |
| 3 | 1E19~7E20 | — | — | ○ | ZnO |
| 4 | 1E19~7E20 | 3E19 | 5 | ○ | ZnO |

| | p$^+$-type region 54d | | | n$^+$-type region 54a |
| --- | --- | --- | --- | --- |
| Sample No. | Doping element concentration (cm$^{-3}$) | Thickness (nm) | Si crystal phase is included | Doping element concentration (cm$^{-3}$) |
| * 1 | — | — | ○ | 2E18~1E20 |
| 2 | — | — | ○ | 2E18~1E20 |
| 3 | 1E19 | 10 | ○ | 2E18~1E20 |
| 4 | 1E19 | 10 | ○ | 2E18~1E20 |

* is an example outside the scope of the present invention.

In Table 7, a sample No. 1 has the conventional configuration outside the scope of the present invention in which there is provided, between a semiconductor junction layer and a transparent intermediate layer, no semiconductor layer of the opposite conductivity type. Although other samples have the configuration of the multi-junction type semiconductor device according to the present invention, the n-type layer 53d serving as a semiconductor layer of the opposite conductivity type is provided only on the side of the first semiconductor junction layer 53 with respect to the sample No. 2, the p$^+$-type region 54d serving as a semiconductor layer of the opposite conductivity type is provided only on the side of the second semiconductor junction layer 54 with respect to the sample No. 3, and the n-type layer 53d and the p$^+$-type region 54d serving as semiconductor layers of opposite conductivity types are respectively provided on both sides of the transparent intermediate layer 56 with respect to the sample No. 4.

A method of measuring and a method of judging the doping element concentration, the thickness, and the presence or absence of inclusion of an Si crystal phase are entirely the same as those shown in the example 3.

The average characteristics (a conversion efficiency, a short-circuit current density Jsc, an open circuit voltage Voc, and a fill factor FF), the yield, and the comprehensive evaluation of the bulk type solar cell device which is each of the samples shown in Table 7 are mentioned in Table 8.

TABLE 8

| | | Device characteristics/Results | | | | |
|---|---|---|---|---|---|---|
| | Sample No. | Conversion efficiency [%] | Jsc [mA/cm$^2$] | Voc [V] | FF | Yield [%] | Comprehensive evaluation |
| * | 1 | 14.23 | 13.25 | 1.450 | 0.741 | 80~90 | — |
| | 2 | 14.48 | 13.23 | 1.453 | 0.753 | 85~95 | ○ |
| | 3 | 14.45 | 13.21 | 1.452 | 0.753 | 85~95 | ○ |
| | 4 | 14.56 | 13.19 | 1.455 | 0.759 | 95~100 | ⊚ |

* is an example outside the scope of the present invention.

As to the comprehensive evaluation, judgment was made by two types of evaluations, i.e., ○ in which a good effect is obtained, and ⊚ in which a significant effect is obtained using the conventional configuration of the sample No. 1 as the basis.

From Table 8, with respect to all the samples. Nos. 2 to 4 having the configuration of the present invention, the average characteristics (a conversion efficiency, a short-circuit current density Jsc, an open circuit voltage Voc, and a fill factor FF) and the yield have effects above-those in the sample No. 1 having the conventional configuration outside the scope of the present invention, so that substantially good results are obtained. Particularly, with respect to the sample No. 4 in which the semiconductor layer of the opposite conductivity type is provided on both sides of the transparent intermediate layer 56, a very good effect was obtained. Therefore, it could be confirmed that the thin film cell/bulk cell stacking type solar cell device having the configuration of the multi-junction type semiconductor device according to the present invention had a great effect on improvement in device characteristics and improvement in yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multi-junction type solar cell device comprising:
a first electrode;
a first solar cell element comprising;
a first-conductivity type semiconductor on the first electrode, and
a second-conductivity type semiconductor configured to form a first p-n junction or a first p-i-n junction with the first-conductivity type semiconductor, an intermediate conductor on the second-conductivity type semiconductor;
a second solar cell element on the intermediate conductor comprising a second p-n junction or a second p-i-n junction; and
a second electrode on the second solar cell element,
wherein an interposed first-conductivity type semiconductor is located between the second-conductivity type semiconductor and the intermediate conductor.

2. The multi-junction type solar cell device according to claim 1, wherein the concentration of a doping element in the interposed first-conductivity type semiconductor is not less than $1\times10^{18}$/cm$^3$ nor more than $5\times10^{21}$/cm$^3$ over a predetermined thickness d1 in a contact region where the interposed first-conductivity type semiconductor and the second-conductivity type semiconductor are in contact with each other.

3. The multi-junction type solar cell device according to claim 2, wherein the predetermined thickness d1 is not less than the thickness of one atomic layer.

4. The multi-junction type solar cell device according to claim 1, wherein the concentration of a doping element in the second-conductivity type semiconductor is not less than $1\times10^{18}$/cm$^3$ nor more than $5\times10^{21}$/cm$^3$ over a predetermined thickness d2 in a contact region where the interposed first-conductivity type semiconductor and the second-conductivity type semiconductor are in contact with each other.

5. The multi-junction type solar cell device according to claim 4, wherein the predetermined thickness d2 is not less than the thickness of one atomic layer.

6. The multi-junction type solar cell device according to claim 1, wherein the thickness of the interposed first-conductivity type semiconductor is not more than 5 nm.

7. The multi-junction type solar cell device according to claim 1, wherein the interposed first-conductivity type semiconductor includes at least one element selected from a group consisting of carbon, oxygen, and nitrogen.

8. A multi-junction type solar cell device comprising:
a first electrode;
a first solar cell element comprising;
a first n-type semiconductor on the first electrode, and
a first p-type semiconductor configured to form a first p-n junction or a first p-i-n junction with the first n-type semiconductor,
an intermediate conductor on the first p-type semiconductor;
a second solar cell element comprising
a second n-type semiconductor on the intermediate conductor,
a second p-type semiconductor configured to form a second p-n junction or a second p-i-n junction with the second n-type semiconductor, and
a second electrode on the second p-type semiconductor,
wherein an interposed n-type semiconductor is located between the first p-type semiconductor and the intermediate conductor, and an interposed p-type semiconductor is located between the second n-type semiconductor and the intermediate conductor.

9. The multi-junction type solar cell device according to claim 8, wherein the concentration of a doping element in the interposed n-type semiconductor is not less than $1\times10^{18}/cm^3$ nor more than $5\times10^{21}/cm^3$ over a predetermined thickness d1 in a contact region where the interposed n-type semiconductor and the first p-type semiconductor are in contact with each other.

10. The solar cell device according to claim 9, wherein the predetermined thickness d1 is not less than the thickness of one atomic layer.

11. The multi-junction type solar cell device according to claim 8, wherein the concentration of a doping element in the first p-type semiconductor is not less than $1\times10^{18}/cm^3$ nor more than $5\times10^{21}/cm^3$ over a predetermined thickness d2 in a contact region where the interposed n-type semiconductor and the first p-type semiconductor are in contact with each other.

12. The multi-junction type solar cell device according to claim 11, wherein the predetermined thickness d2 is not less than the thickness of one atomic layer.

13. The multi-junction type solar cell device according to claim 8, wherein the thickness of the interposed n-type semiconductor is not more than 5 nm.

14. The multi-junction type solar cell device according to claim 8, wherein the interposed n-type semiconductor includes at least one element selected from a group consisting of carbon, oxygen, and nitrogen.

15. The multi-junction type solar cell device according to claim 8, wherein the first or the second electrode is composed of a metal material.

16. The multi-junction type solar cell device according to claim 8, wherein the first or the second electrode is composed of a transparent conductive material.

* * * * *